(12) United States Patent
Ko et al.

(10) Patent No.: US 12,027,423 B2
(45) Date of Patent: Jul. 2, 2024

(54) FORMING ISOLATION REGIONS FOR SEPARATING FINS AND GATE STACKS

(71) Applicant: Taiwan Semiconductor Manufacturing Co., Ltd., Hsinchu (TW)

(72) Inventors: Chung-Ting Ko, Kaohsiung (TW); Tai-Chun Huang, Hsinchu (TW); Jr-Hung Li, Chupei (TW); Tze-Liang Lee, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 37 days.

(21) Appl. No.: 17/813,850

(22) Filed: Jul. 20, 2022

(65) Prior Publication Data
US 2022/0359299 A1    Nov. 10, 2022

Related U.S. Application Data

(62) Division of application No. 16/933,386, filed on Jul. 20, 2020, now Pat. No. 11,437,277.

(60) Provisional application No. 63/016,495, filed on Apr. 28, 2020.

(51) Int. Cl.
*H01L 21/8234* (2006.01)
*H01L 27/088* (2006.01)
*H01L 29/66* (2006.01)

(52) U.S. Cl.
CPC ......... *H01L 21/823431* (2013.01); *H01L 21/823481* (2013.01); *H01L 27/0886* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 10,522,414 B2 | 12/2019 | Chang et al. |
| 10,566,326 B2 | 2/2020 | Kwak et al. |
| 10,636,886 B2 | 4/2020 | Jo et al. |
| 11,094,593 B2 | 8/2021 | Jun et al. |
| 11,211,450 B2 | 12/2021 | Park et al. |

(Continued)

FOREIGN PATENT DOCUMENTS

| | | |
|---|---|---|
| KR | 20180018947 A | 2/2018 |
| KR | 20180034012 A | 4/2018 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method includes forming a semiconductor fin protruding higher than top surfaces of isolation regions. The isolation regions extend into a semiconductor substrate. A portion of the semiconductor fin is etched to form a trench, which extends lower than bottom surfaces of the isolation regions, and extends into the semiconductor substrate. The method further includes filling the trench with a first dielectric material to form a first fin isolation region, recessing the first fin isolation region to form a first recess, and filling the first recess with a second dielectric material. The first dielectric material and the second dielectric material in combination form a second fin isolation region.

20 Claims, 21 Drawing Sheets

(56) References Cited

U.S. PATENT DOCUMENTS

| | | | |
|---|---|---|---|
| 2015/0021710 A1* | 1/2015 | Hsu | H01L 21/823425 |
| | | | 257/401 |
| 2015/0187571 A1 | 7/2015 | Fan et al. | |
| 2015/0206954 A1 | 7/2015 | Lin | |
| 2016/0260802 A1 | 9/2016 | Glass et al. | |
| 2018/0358450 A1* | 12/2018 | Kim | H01L 27/0886 |
| 2019/0067111 A1 | 2/2019 | Tsai et al. | |
| 2019/0122934 A1 | 4/2019 | Chang et al. | |
| 2020/0105604 A1 | 4/2020 | Lin et al. | |
| 2020/0328121 A1* | 10/2020 | Yao | H01L 21/823418 |

FOREIGN PATENT DOCUMENTS

| | | |
|---|---|---|
| KR | 20190107456 A | 9/2019 |
| KR | 20190112910 A | 10/2019 |
| TW | 201616581 A | 5/2016 |
| TW | 202013510 A | 4/2020 |

\* cited by examiner

FORMING ISOLATION REGIONS FOR SEPARATING FINS AND GATE STACKS

PRIORITY CLAIM AND CROSS-REFERENCE

This application is a divisional of U.S. application Ser. No. 16/933,386, entitled "Forming Isolation Regions for Separating Fins and Gate Stacks," and filed Jul. 20, 2020, which claims the benefit of the following provisionally filed U.S. Patent application: Application No. 63/016,495, filed on Apr. 28, 2020, and entitled "Universal Seam-Free SiN Gapfill Formation After Global SiN Recess," which applications are hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down process has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically includes forming long semiconductor fins and long gate stacks, and then forming isolation regions to cut the long semiconductor fins and long gate stacks into shorter portions, so that the shorter portions may act as the fins and the gate stacks of FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
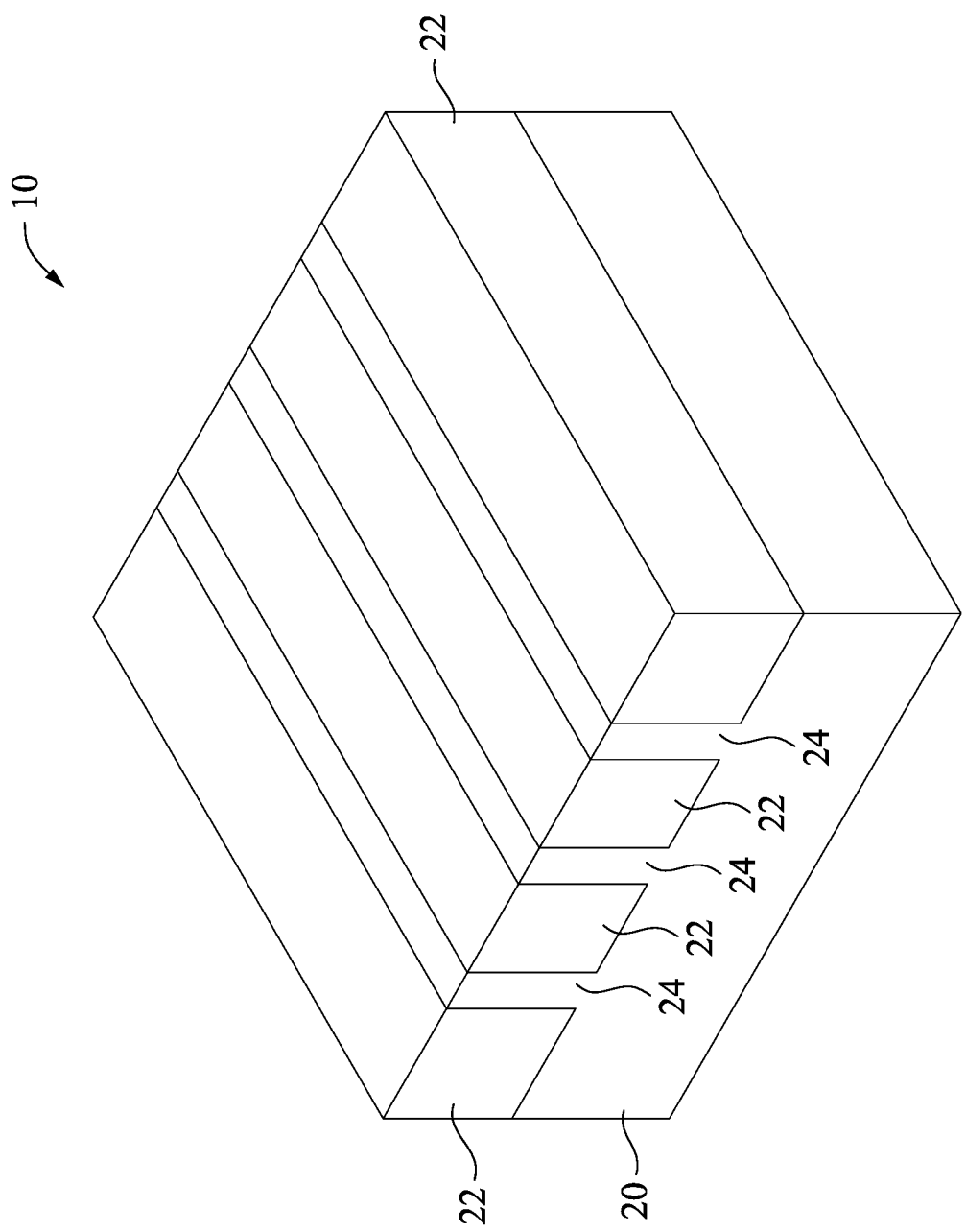
FIGS. 1-4, 5A, 5B, 6, 7A, 7B, 8A, 8B, and 9-15 illustrate the perspective views, cross-sectional views, and top views of intermediate stages in the formation of isolation regions and Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Isolation regions for cutting fins and gate stacks, Fin Field-Effect Transistors (FinFETs), and the method of forming the same are provided in accordance with some embodiments. In accordance with some embodiments of the present disclosure, gate isolation regions and fin isolation regions are formed and then recessed, and a dielectric material is filled into the resulting recesses. Through this process, the seam generated in the gate isolation regions and fin isolation regions may be sealed. In accordance with some illustrated embodiments, the formation of FinFETs is used as an example to explain the concept of the present disclosure. Other types of transistors such as planar transistors, Gate-All-Around (GAA) transistors, or the like may also adopt the embodiments of the present disclosure to cut the corresponding active regions and gate stacks. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6, 7A, 7B, 8A, 8B, and 9-15 illustrate the perspective views, cross-sectional views, and top views of intermediate stages in the formation of isolation regions and Fin Field-Effect Transistors (FinFETs) in accordance with some embodiments. The corresponding processes are also reflected schematically in the process flow shown in FIG. 17.

Figure 17:
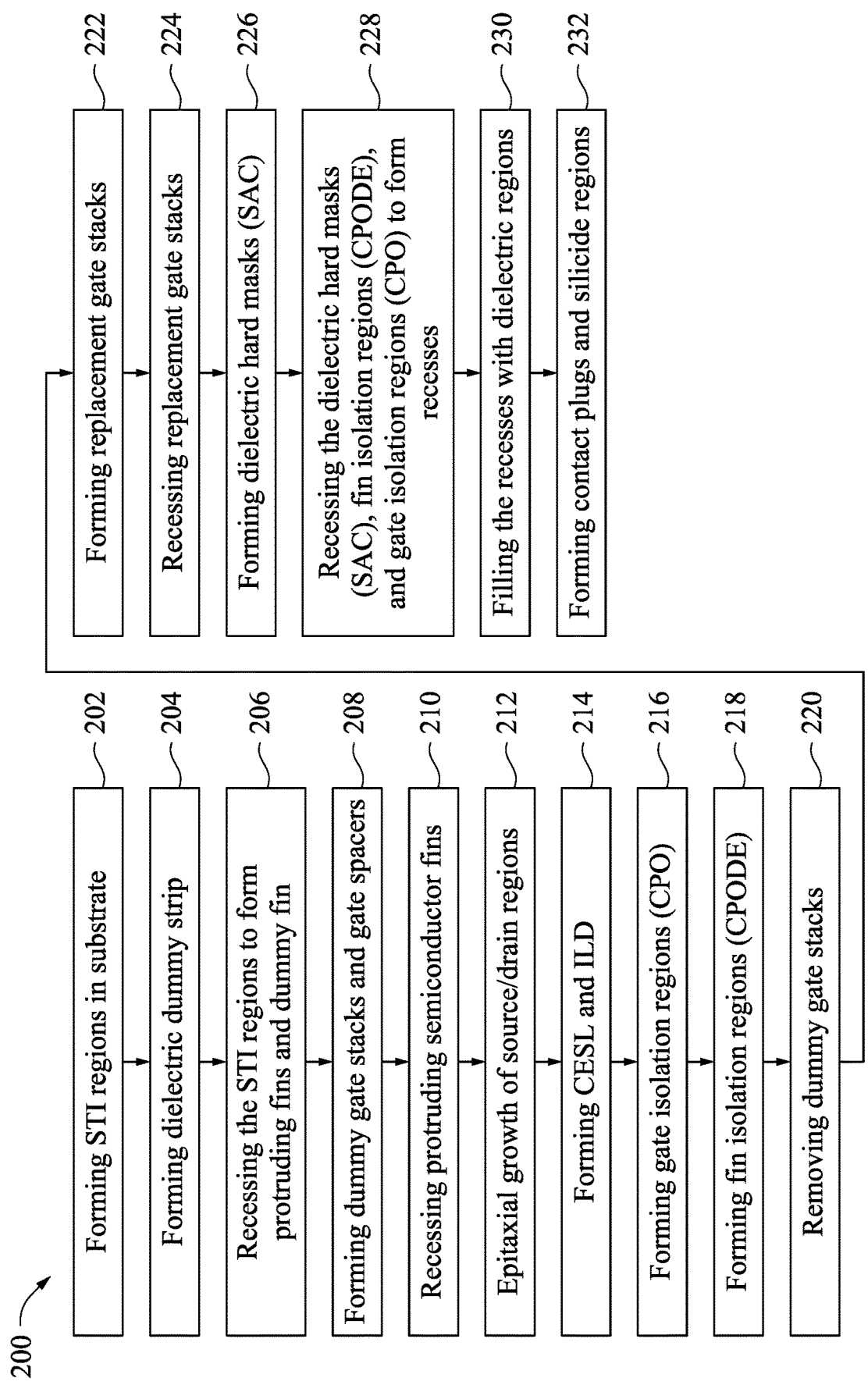
FIG. 17 illustrates a process flow for forming isolation regions and FinFETs in accordance with some embodiments.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 17. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, SiC, SiPC, SiGe, SiGeB, Ge, a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

Figure 2:
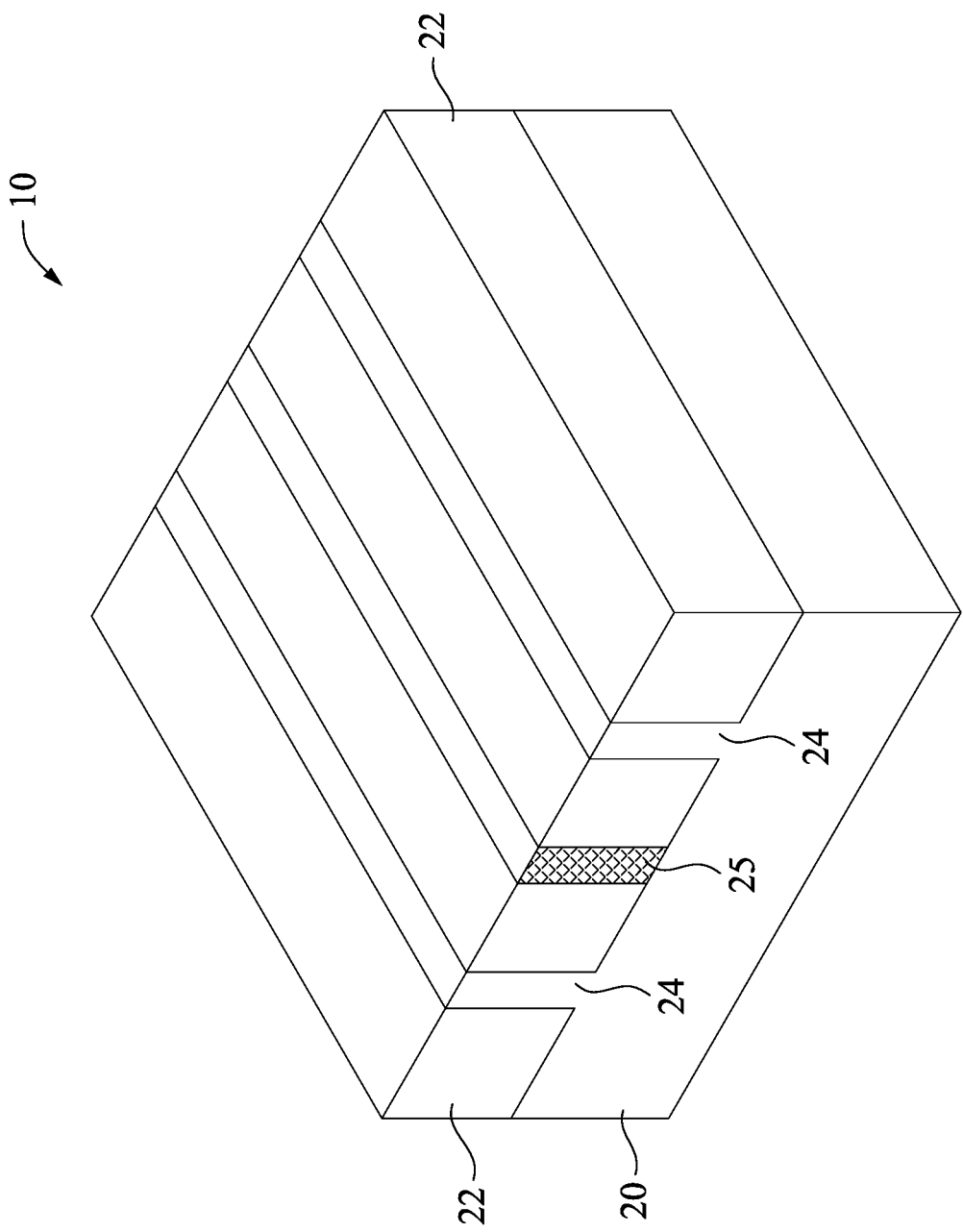

FIG. 2 illustrates the formation of dielectric dummy strip 25, which may be formed by etching one of the semiconductor strips 24 to form a recess, and then filling the recess with a dielectric material. The respective process is illustrated as process 204 in the process flow 200 as shown in FIG. 17. The dielectric material may be formed of or comprise a high-k dielectric material such as silicon nitride. Also, the material of dielectric dummy strip 25 is selected so that it has a high etching selectivity with relative to the materials of the subsequently formed dummy gate stacks and the materials of STI regions 22 (such as silicon oxide). The bottom surface of dielectric dummy strip 25 may be higher than, level with, or lower than, the bottom surfaces of STI regions 22.

Figure 3:
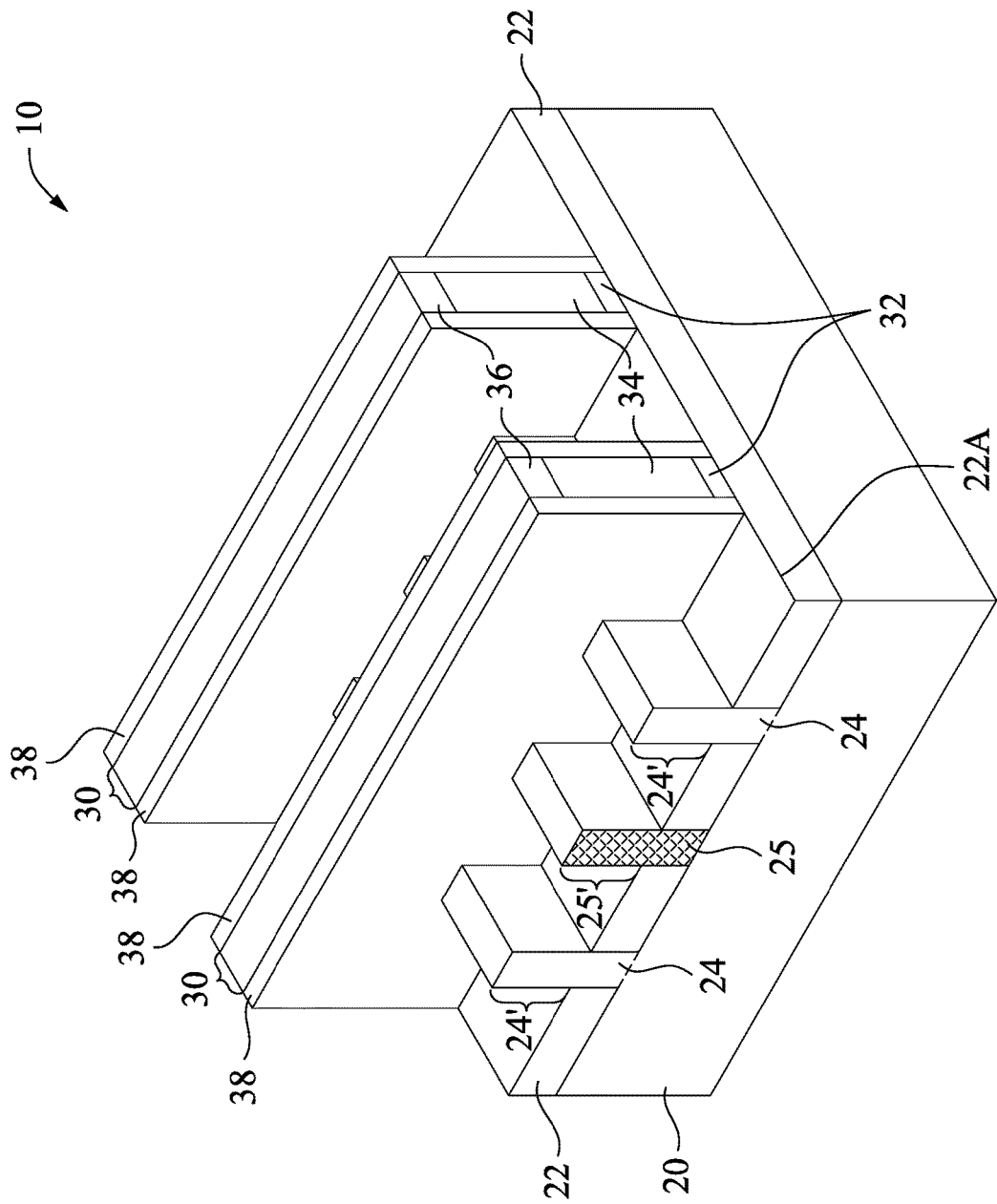

Referring to FIG. 3, STI regions 22 are recessed. The top portions of semiconductor strips 24 and dielectric dummy strip 25 protrude higher than the top surfaces 22A of the remaining portions of STI regions 22 to form protruding fins 24' and dummy fin 25', respectively. The respective process is illustrated as process 206 in the process flow 200 as shown in FIG. 17. The etching may be performed using a dry etching process, wherein etching gases such as the mixture of HF and $NH_3$ may be used. In accordance with alternative embodiments of the present disclosure, the recessing of STI regions 22 is performed using a wet etching process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Further referring to FIG. 3, dummy gate stacks 30 and gate spacers are formed on the top surfaces and the sidewalls of (protruding) fins 24' and dummy fin 25'. The respective process is illustrated as process 208 in the process flow 200 as shown in FIG. 17. Dummy gate stacks 30 may include dummy gate dielectrics 32 and dummy gate electrodes 34 over dummy gate dielectrics 32. Dummy gate electrodes 34 may be formed, for example, using polysilicon or amorphous silicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and dummy fins 25' and/or STI regions 22. Dummy gate stacks 30 also have lengthwise directions perpendicular to the lengthwise directions of protruding fins 24' and dummy fin 25'.

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. Gate spacers 38 may have widths in the range between about 1 nm and about 3 nm.

Figure 4:
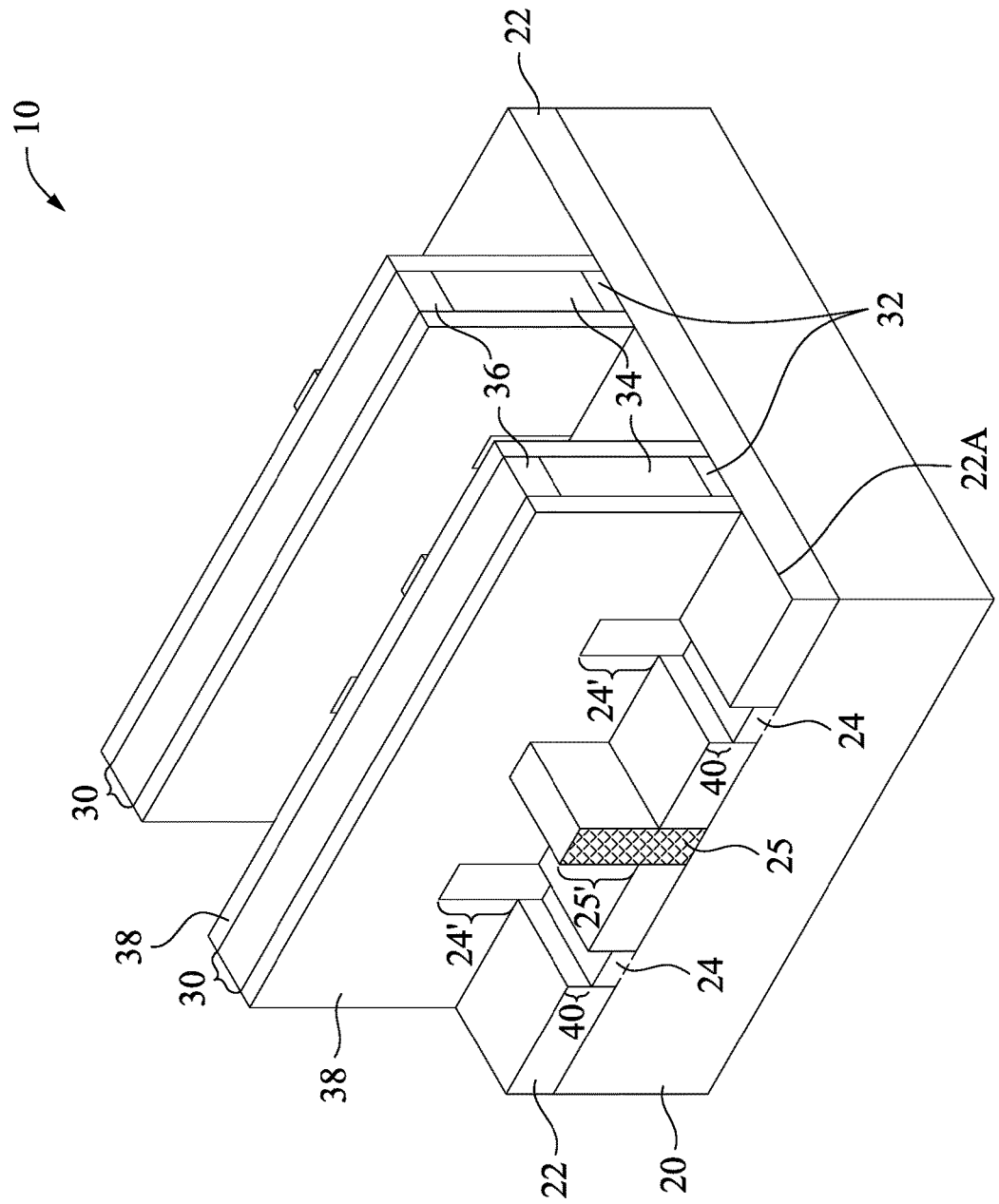

In accordance with some embodiments of the present disclosure, an etching process (referred to as source/drain recessing hereinafter) is performed to etch the portions of protruding fins 24' that are not covered by dummy gate stack 30 and gate spacers 38, resulting in the structure shown in FIG. 4. The respective process is illustrated as process 210 in the process flow 200 as shown in FIG. 17. The recessing may be anisotropic, and hence the portions of protruding fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40. In the etching process, dielectric dummy fin 25' is not etched. For example, protruding fins 24' may be etched using the mixture of $NF_3$ and $NH_3$, the mixture of HF and $NH_3$, or the like.

Figure 5A:
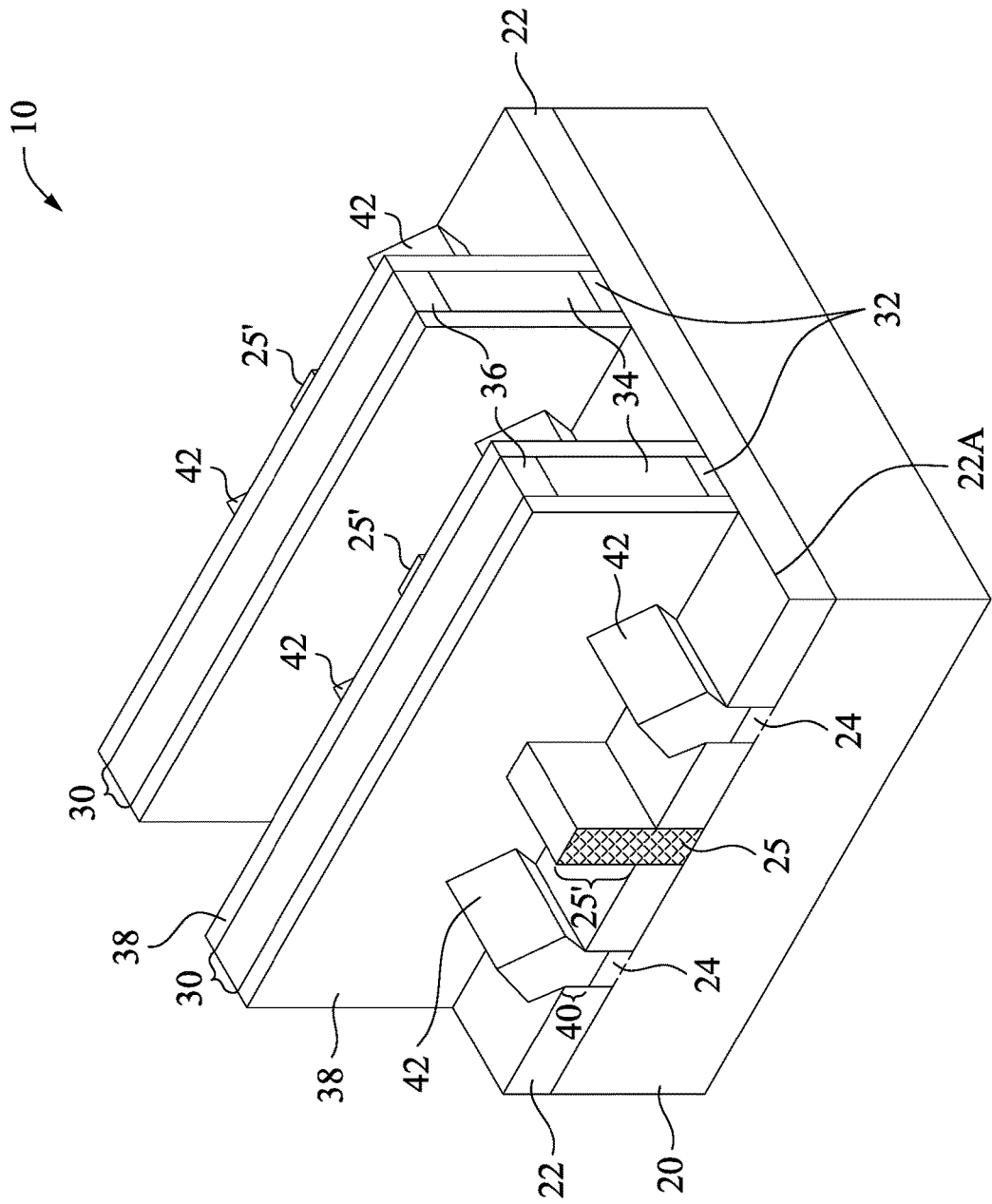

Next, epitaxy regions (source/drain regions) 42 are formed by selectively growing a semiconductor material from recesses 40, resulting in the structure in FIG. 5A. The respective process is illustrated as process 212 in the process flow 200 as shown in FIG. 17. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), SiB, GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

Figure 5B:
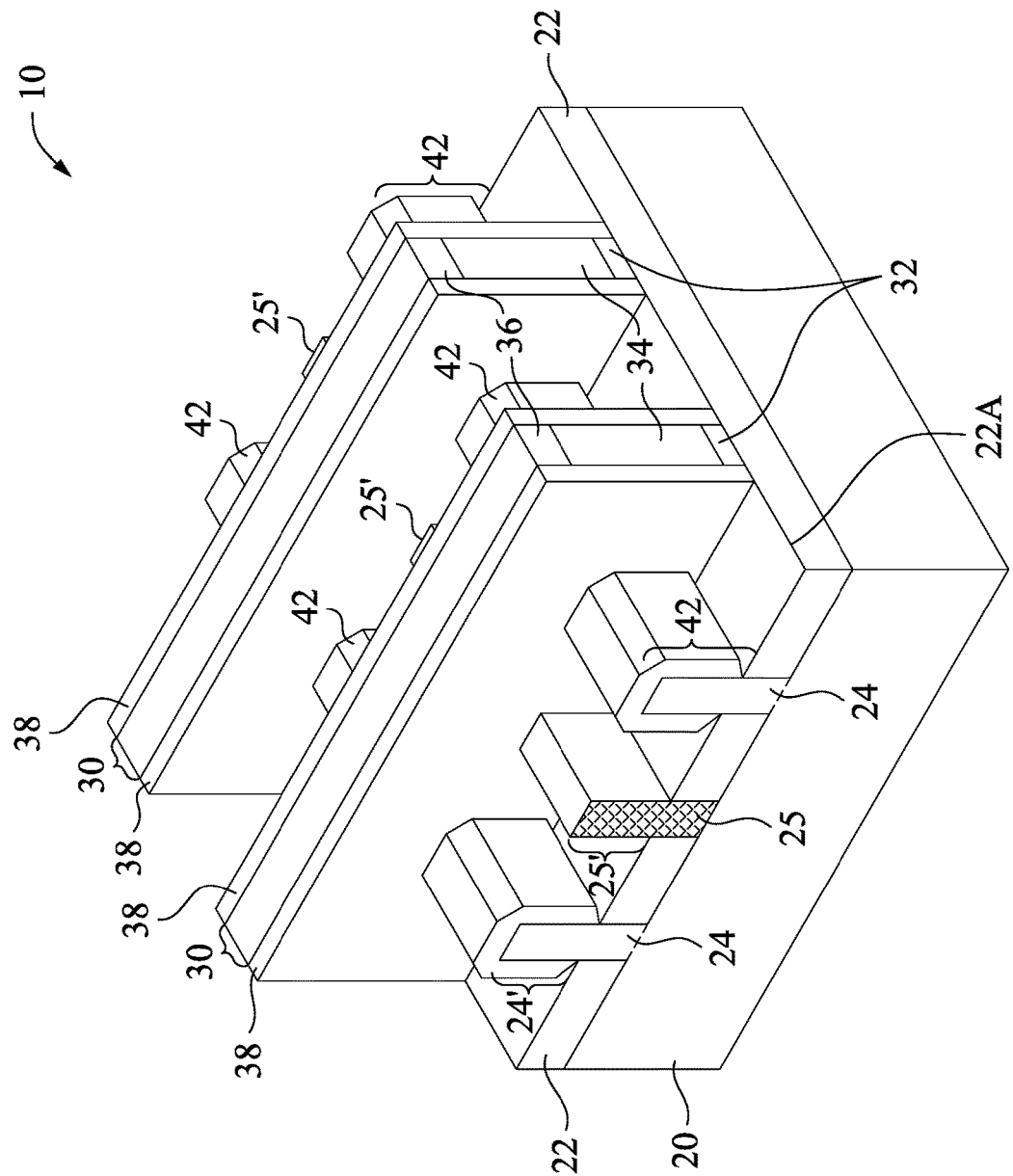

FIG. 5B illustrates the formation of source/drain regions 42 in accordance with alternative embodiments of the present disclosure. In accordance with these embodiments, the protruding fins 24' as shown in FIG. 4 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drain regions 42 include protruding fins 24' and the epitaxy regions 41. An implantation process may (or may not) be performed to implant an n-type impurity or a p-type impurity.

Figure 6:
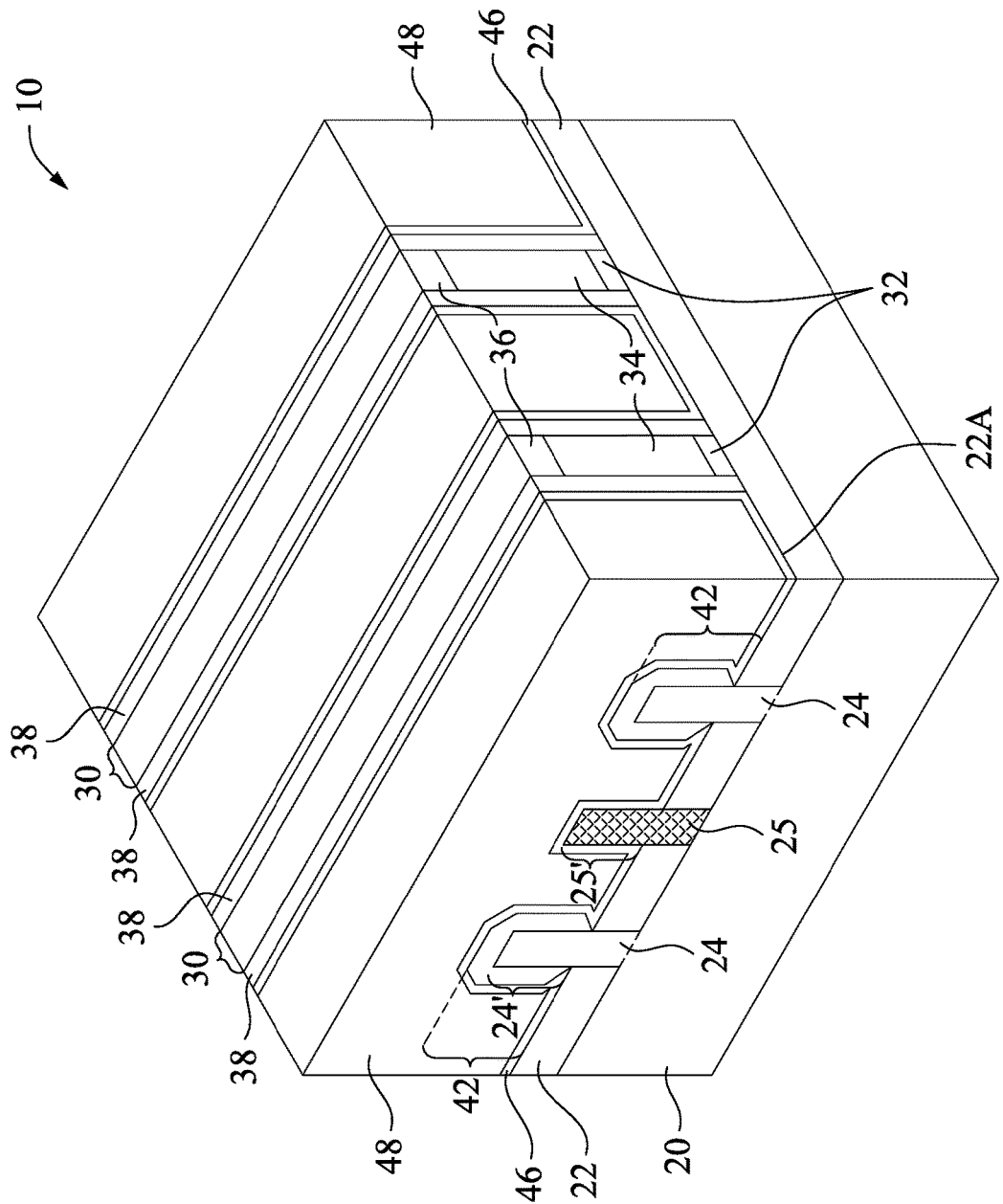

FIG. 6 illustrates a perspective view of the structure after the formation of Contact Etch Stop Layer (CESL) 46 and Inter-Layer Dielectric (ILD) 48. The respective process is illustrated as process 214 in the process flow 200 as shown in FIG. 17. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as Chemical Mechanical Polish (CMP) process or mechanical grinding process is performed to level the top surfaces of ILD 48, dummy gate stacks 30, and gate spacers 38 with each other.

Figure 7A:
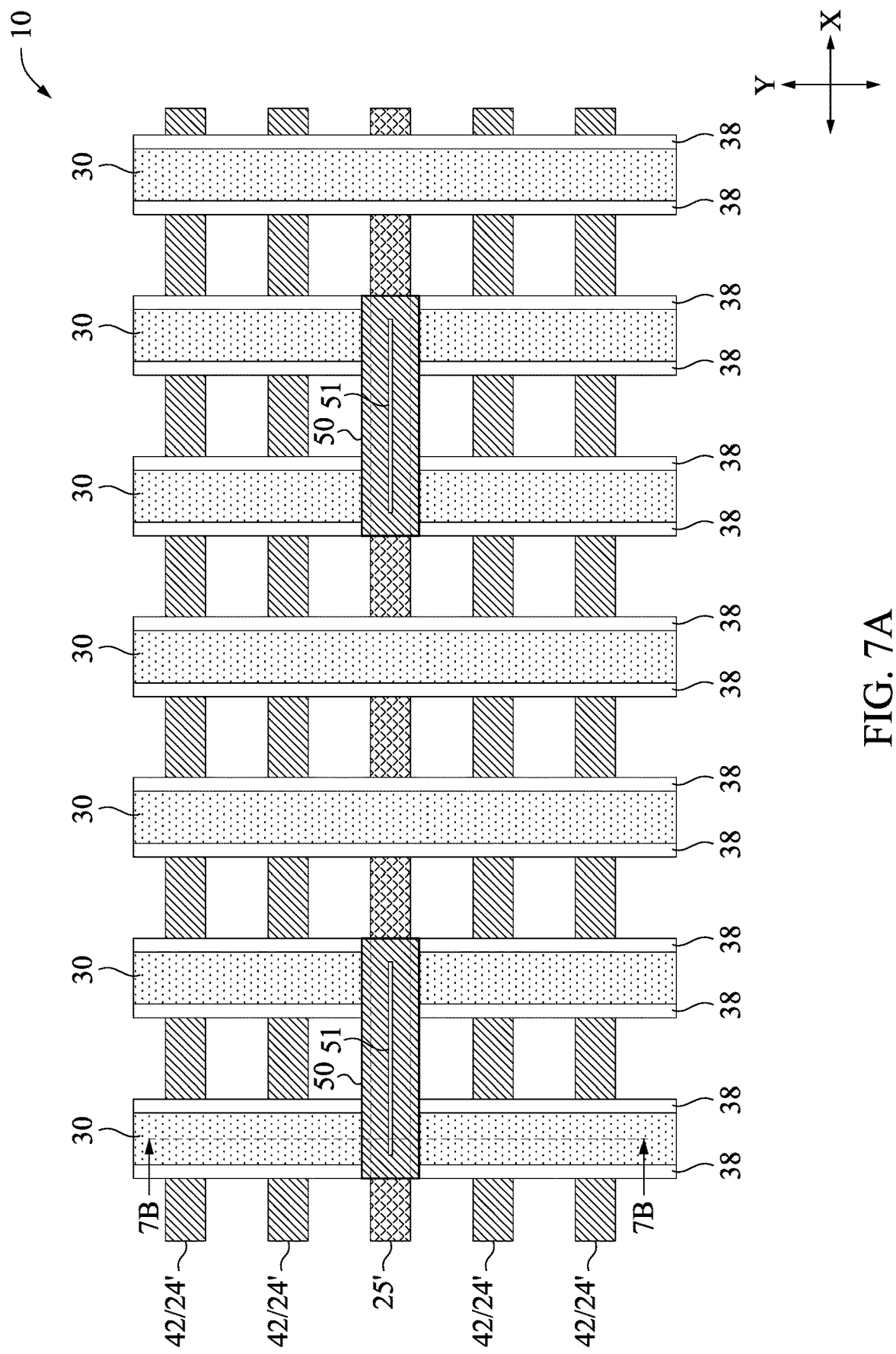

FIG. 7A illustrates a plane view (a top view) of a part of wafer 10 after the formation of gate isolation regions 50, which are sometimes referred to as Cut-Poly (CPO) regions. The respective process is illustrated as process 216 in the process flow 200 as shown in FIG. 17. The respective process may also be referred to as a CPO process. Protruding fins 24', dielectric dummy fins 25', dummy gate stacks 30, and gate spacers 38 are illustrated. The protruding fins 24' may be directly underlying dummy gate stacks 30, and source/drain regions 42 are formed between dummy gate stacks 30. It is appreciated that the source/drain regions 42 grown from neighboring protruding fins 24' may be merged, which are not shown in FIG. 7A for clarity of the drawing. Protruding fins 24' are elongated strips having lengthwise directions in the X-direction. Dummy gate stacks 30 are formed as elongated strips having lengthwise directions in the Y-direction.

Figure 7B:
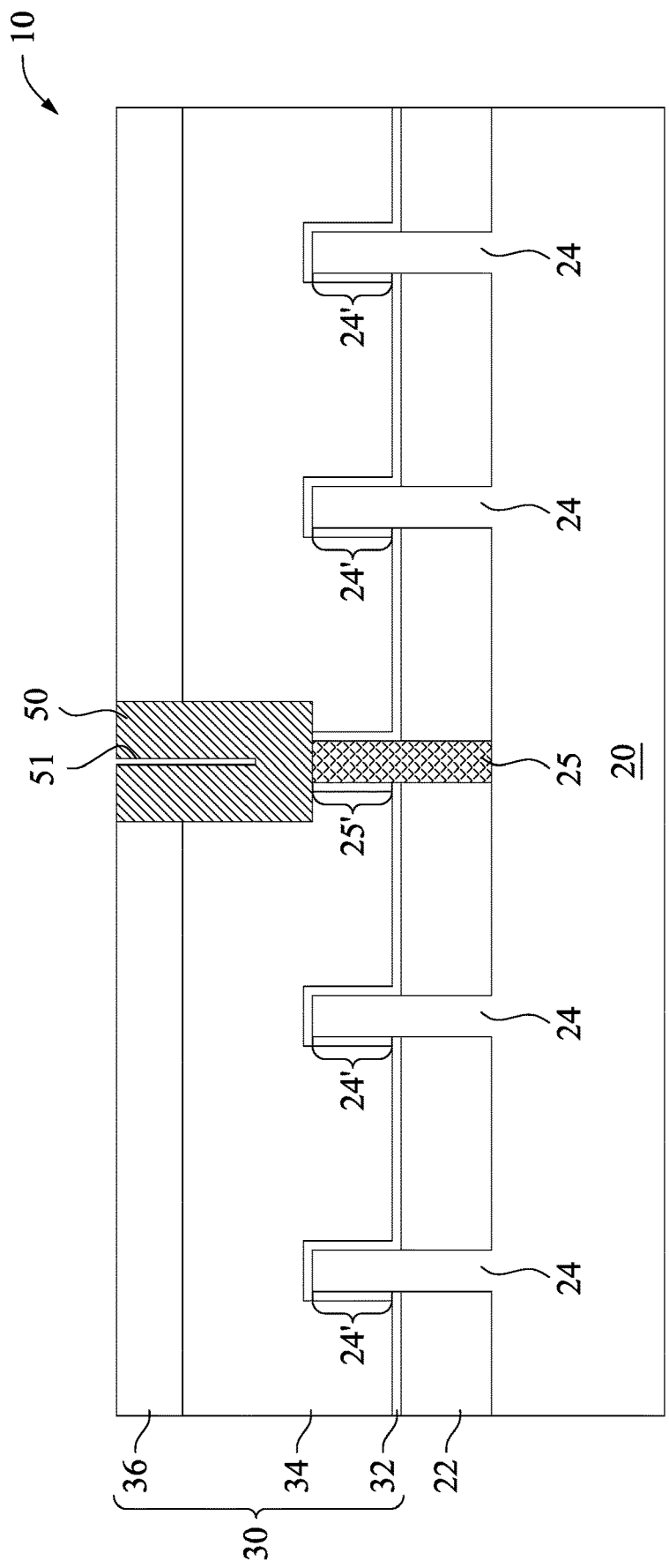

FIG. 7B illustrates a cross-sectional view obtained from reference cross-section 7B-7B in FIG. 7A. Gate isolation regions 50 are formed to separate the long dummy gate stacks 30 into shorter portions, so that the shorter dummy gate stacks 30 may act as the dummy gate stacks of different FinFETs. It is appreciated that in the illustrated example embodiments, gate isolation regions 50 are formed before replacement gate stacks are formed. In other embodiments, gate isolation regions 50 may also be formed after the formation of replacement gate stacks, and hence the replacement gates stacks are cut by gate isolation regions 50. In accordance with some embodiments, the formation of gate isolation regions 50 includes forming an etching mask such as a patterned photo resist, wherein the regions in which gate isolation regions 50 (FIG. 7A) are to be formed are revealed through the openings in the etching mask. The openings in the etching mask are directly over some portions of dummy fin 25'. The portions of dummy gate stacks 30 revealed through the etching mask are then etched. The etching may be stopped after dummy fin 25' is revealed, as may be perceived from FIG. 7B. Next, the etching mask is removed, and a dielectric material is deposited to fill the openings in dummy gate stacks 30.

In accordance with some embodiments, the deposition of the dielectric material is performed using a conformal deposition method such as Atomic Layer Deposition (ALD), which may be Plasma-Enhance ALD (PEALD), thermal ALD, or the like. The dielectric material may be formed of or comprise SiN, $SiO_2$, SiOC, SiOCN, or the like, or combinations thereof. In accordance with some embodiments, the dielectric material comprises SiN, and the deposition is performed using process gases including dichlorosilane ($SiH_2Cl_2$) and ammonia ($NH_3$). Hydrogen ($H_2$) may also be added. The deposition process may be performed using PEALD at a temperature in a range between about 450° C. and about 650° C. After the deposition process, a planarization process such as a CMP process or a mechanical grinding process is performed. The remaining portions of the dielectric material are gate isolation regions 50. Seams 51 may be formed in the middle of gate isolation regions, as shown in FIGS. 7A and 7B. Seam 51 may have a width in a range between about 0.5 nm and about 2 nm.

Figure 8A:
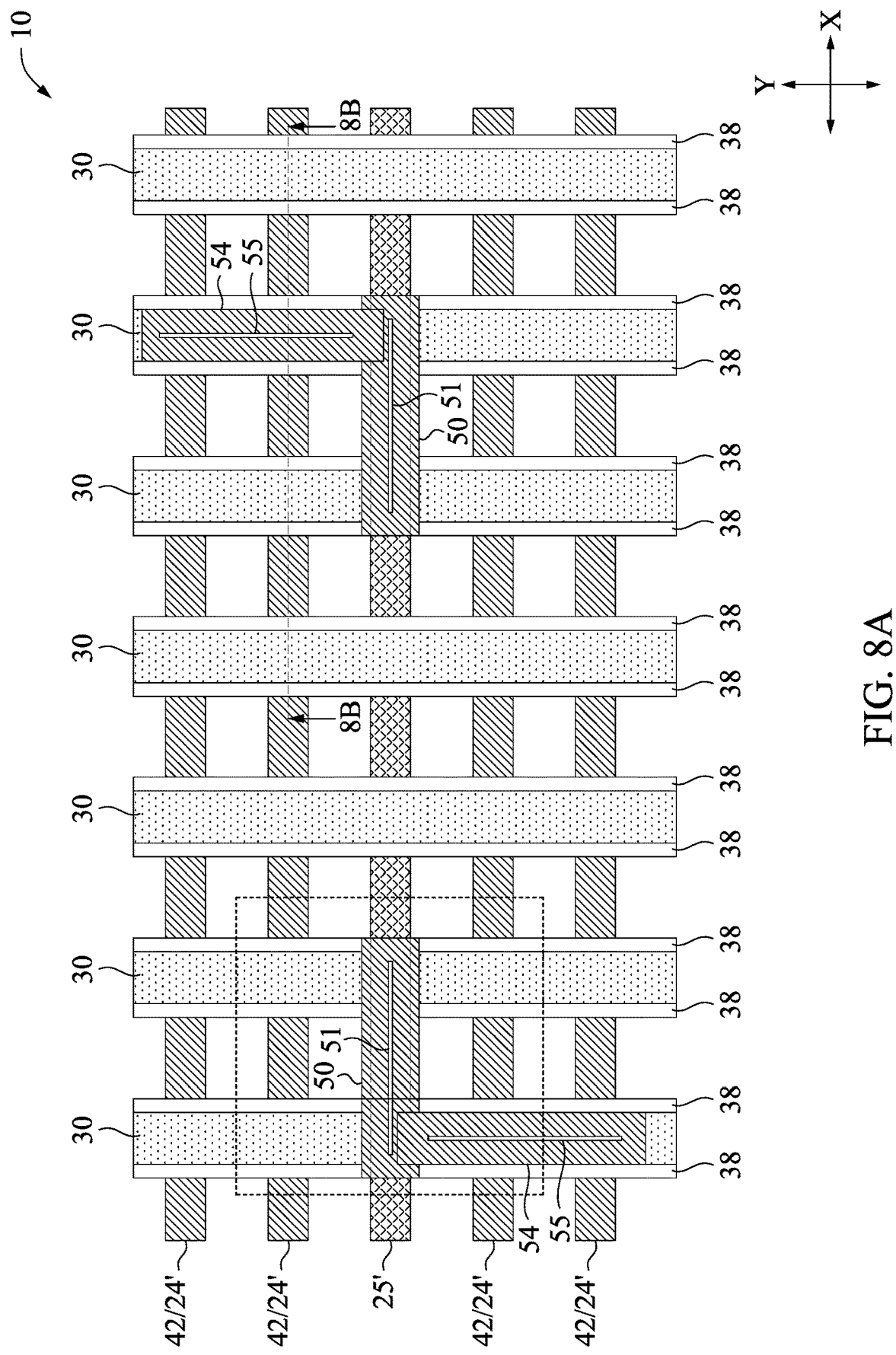

FIG. 8A illustrates a plane view of the formation of fin isolation regions 54, which are sometimes referred to as Cut-Poly on OD Edge (CPODE) regions. The respective process is illustrated as process 218 in the process flow 200 as shown in FIG. 17. The respective process may also be referred to as a CPODE process. Fin isolation regions 54 separate the long protruding fins 24' into shorter portions, so that the shorter protruding fins 24' may act as the active regions (such as channels) of different FinFETs. Fin isolation regions 54 may also separate the source/drain regions of neighboring FinFETs from each other.

Figure 8B:
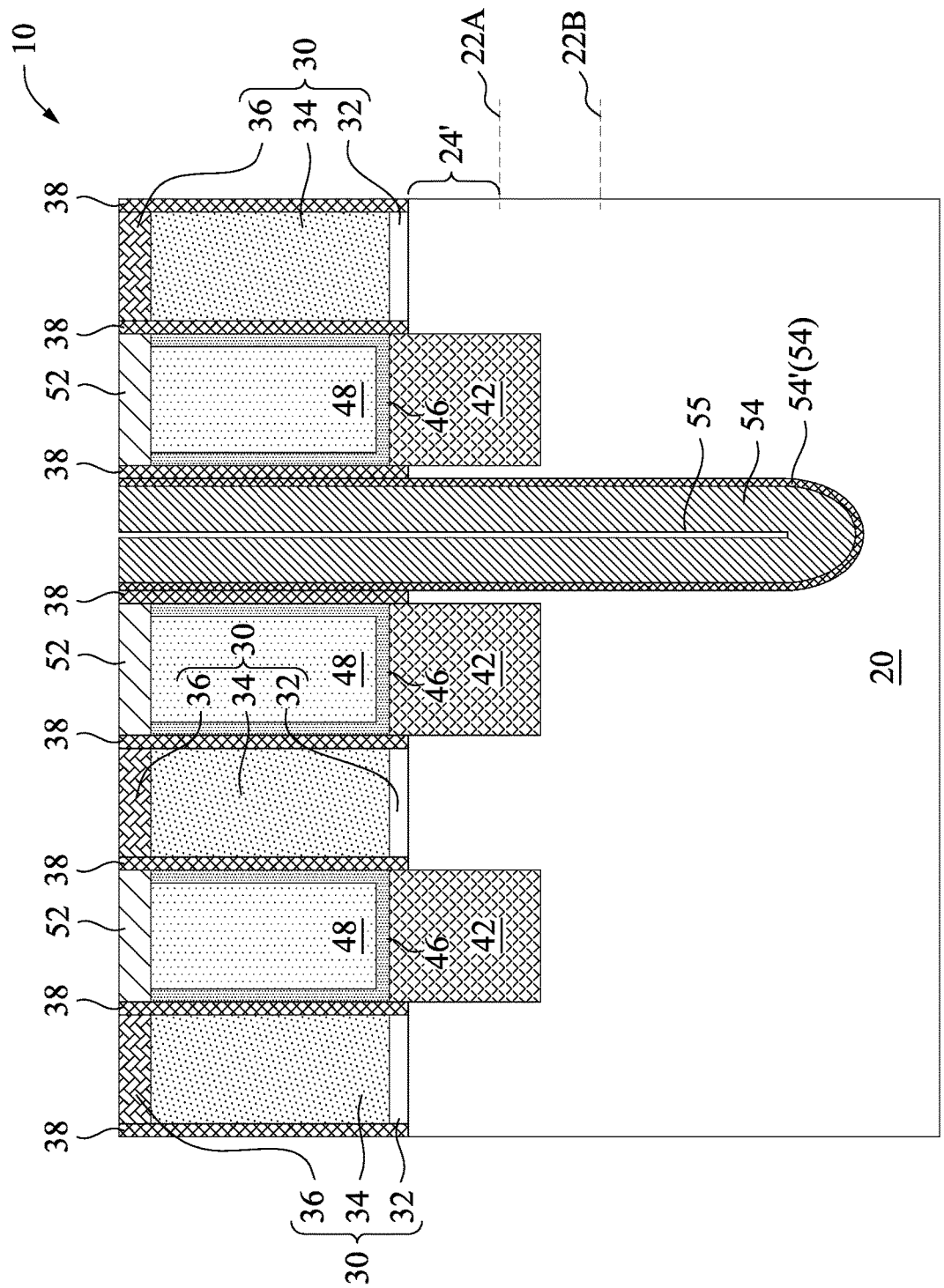

FIG. 8B illustrates a cross-sectional view obtained from reference cross-section 8B-8B in FIG. 8A. In accordance with some embodiments, the formation of fin isolation regions 54 includes forming an etching mask, and using the etching mask to etch dummy gate stacks 30. In the etching process, dummy gate stacks 30 are first etched anisotropically, until the underlying protruding fins 24' are exposed. The etching may be stopped on STI regions 22. The protruding fins 24' are then etched, and the etching continues down into the underlying semiconductor strips 24, and further into the underlying bulk portions of semiconductor substrate 20. STI regions 22 act as the etching mask to define the patterns of the resulting openings. Next, a dielectric material is deposited into the resulting openings formed by the etching process, followed by a planarization process to remove excess portions of the dielectric material. The remaining dielectric material forms fin isolation regions 54.

In accordance with some embodiments, dielectric masks 52 are formed (either before or after the formation of fin isolation regions 54) to protect ILD 48. The formation of dielectric masks 52 may include recessing ILD 48, and filling the resulting recess with a dielectric material. Dielectric masks 52 may be formed of or comprise SiN, $SiO_2$, SiOC, SiOCN, or the like. The material of dielectric masks 52 may be the same as or different from the material of fin isolation regions 54.

In accordance with some embodiments, the deposition of the dielectric material of isolation regions 54 is performed using a conformal deposition process such as ALD, which may be PEALD, thermal ALD, or the like. The dielectric material may be formed of or comprise SiN, $SiO_2$, SiOC, SiOCN, or the like, or combinations thereof. Fin isolation regions 54 may be formed of a homogenous material, or may have a composite structure including more than one layer. For example, FIG. 8B illustrates that fin isolation regions 54 may include dielectric liners 54', which may be formed of, for example, silicon oxide. In accordance with some embodiments, the dielectric material of isolation regions 54 comprises SiN, and the deposition is performed using process gases including dichlorosilane and ammonia. Hydrogen ($H_2$) may or may not be added. The deposition process may be performed using PEALD at a temperature in a range between about 450° C. and about 650° C. Seams 55 may be formed in the middle of fin isolation regions 54, as shown in FIGS. 8A and 8B. Seams 55 may have a width in a range between about 0.5 nm and about 2 nm. In FIG. 8B, the top surface 22A and bottom surface 22B of STI regions are marked to illustrate where STI regions 22 are.

Figure 9:
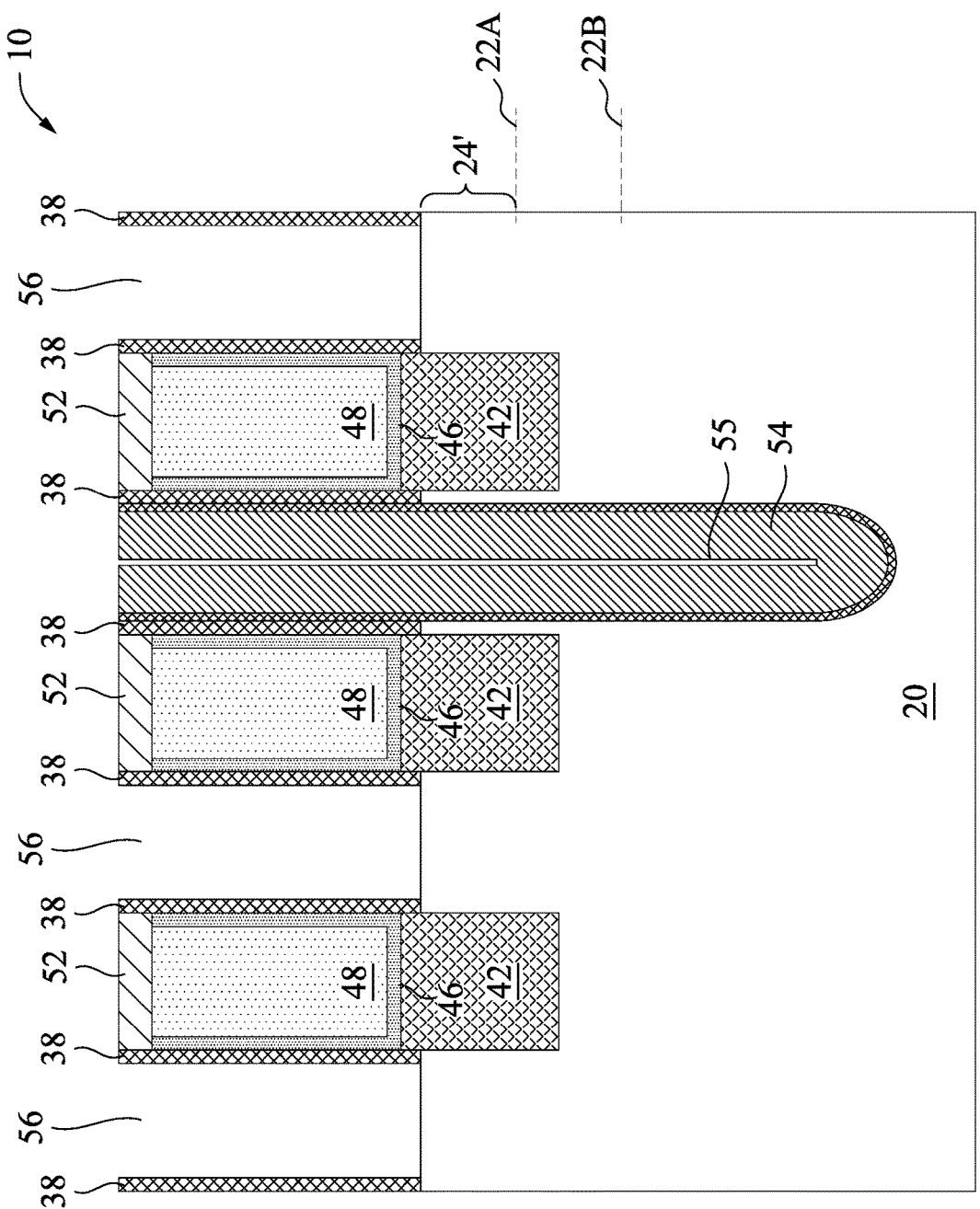
Figure 10:
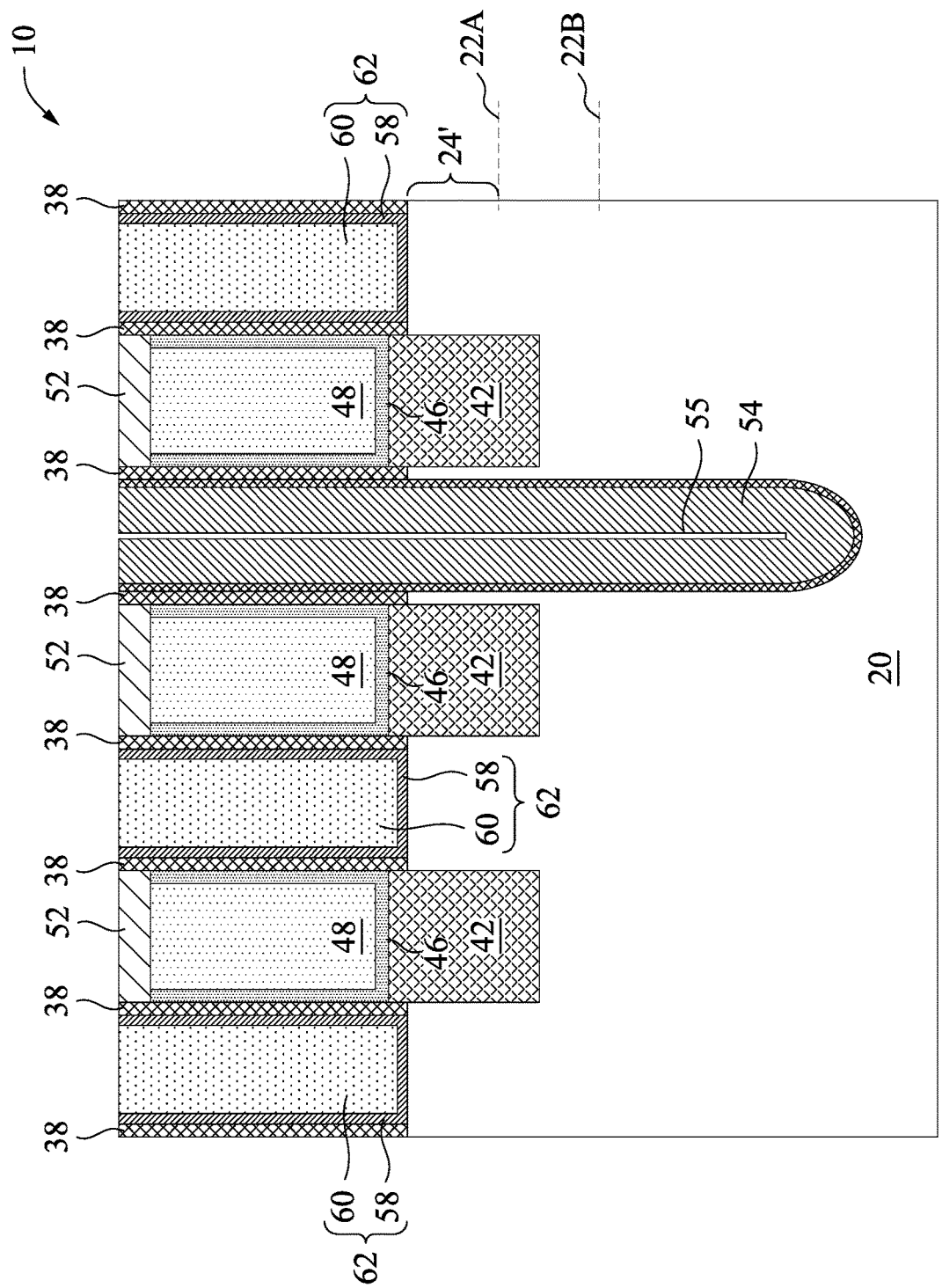

FIGS. 9 and 10 illustrate the formation of replacement gate stacks 62. The dummy gate stacks 30 as shown in FIG. 8B are removed through etching, and trenches 56 are formed, as shown in FIG. 9. The respective process is illustrated as process 220 in the process flow 200 as shown in FIG. 17. Next, as shown in FIG. 10, (replacement) gate stacks 62 are formed, which include gate dielectric layers 58 and gate electrodes 60. The respective process is illustrated as process 222 in the process flow 200 as shown in FIG. 17. The formation of gate stacks 62 includes forming/depositing a plurality of layers, and then performing a planarization process such as a CMP process or a mechanical grinding process. In accordance with some embodiments of the present disclosure, each of gate dielectric layers 58 includes an Interfacial Layer (IL) as its lower part. The IL is formed on the exposed surfaces of protruding fins 24'. The IL may include an oxide layer such as a silicon oxide layer, which is formed through the thermal oxidation process or a chemical oxidation process to oxidize a surface layer of each of protruding fins 24', or a deposition process. Each of gate dielectric layers 58 may also include a high-k dielectric layer formed over the IL. The high-k dielectric layer may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer may be formed as conformal layers, and extends on the sidewalls of protruding fins 24' and the sidewalls of gate spacers 38. Gate dielectric layers 58 also extend on the top surfaces and the sidewalls of some portions of dielectric dummy fin 25', except there may not be IL formed on dielectric dummy fin 25' if IL is formed through thermal oxidation. In accordance with some embodiments of the present disclosure, the high-k dielectric layers in gate dielectric layers 58 are formed using ALD, CVD, or the like.

Gate electrodes 60 are formed on top of gate dielectric layers 58, and fill the remaining portions of the trenches left by the removed dummy gate stacks. The sub-layers in gate electrodes 60 are not shown separately, while the sub-layers may be distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 60 (and each of sub-layers) are substantially equal to each other.

The sub-layers in gate electrodes 60 may include, and are not limited to, a Titanium Silicon Nitride (TiSN) layer, a tantalum nitride (TaN) layer, a titanium nitride (TiN) layer, a titanium aluminum (TiAl) layer, an additional TiN and/or TaN layer, and a filling metal region. Gate electrodes 60 are referred to as metal gates 60 hereinafter. Some of these sub-layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include tungsten, cobalt, or the like.

Figure 11:
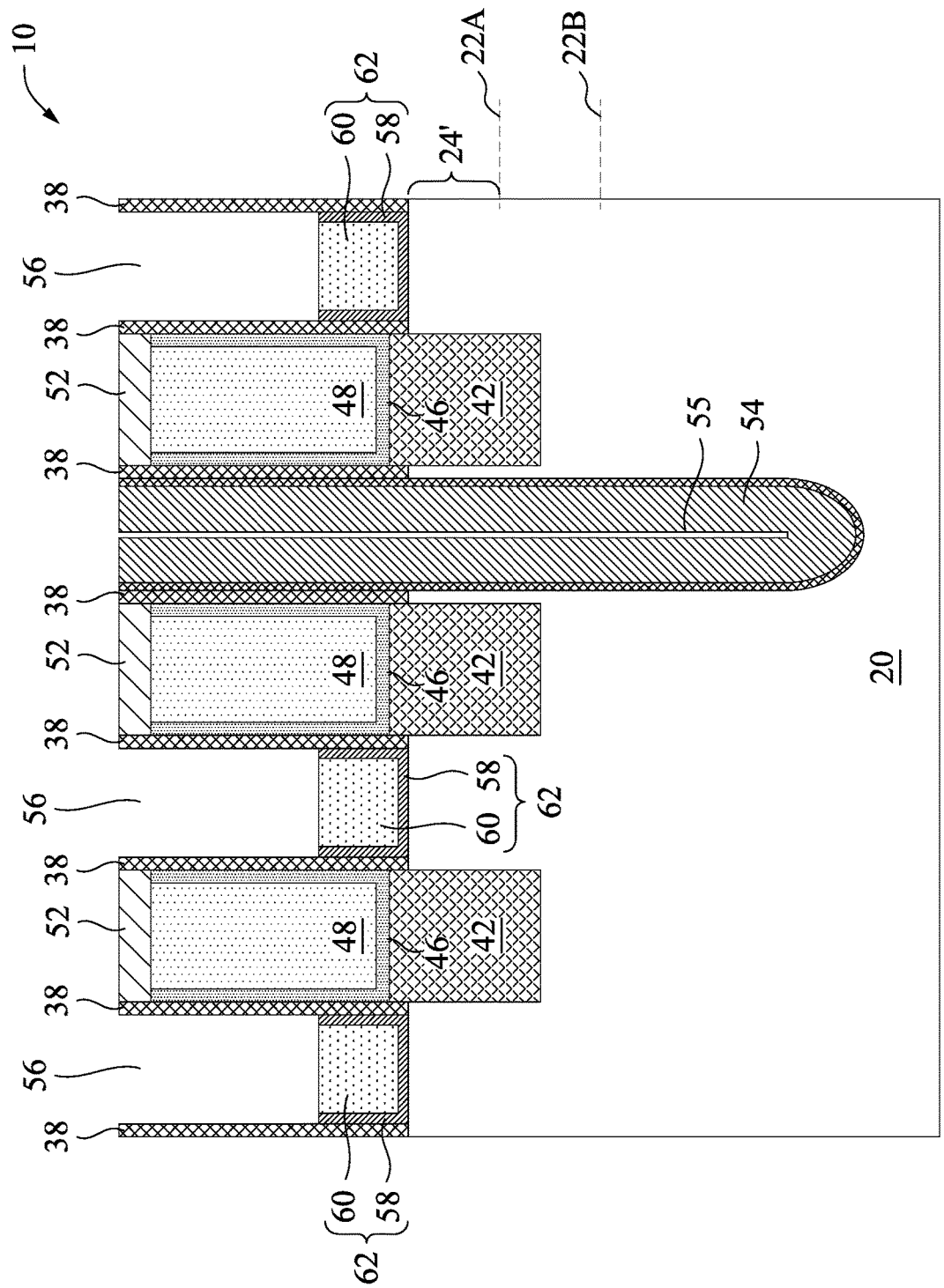

FIG. 11 illustrates the recessing of replacement gate stacks 62, for example, through etching processes, hence the top portions of trenches 56 are formed again. The respective process is illustrated as process 224 in the process flow 200 as shown in FIG. 17.

Figure 12:
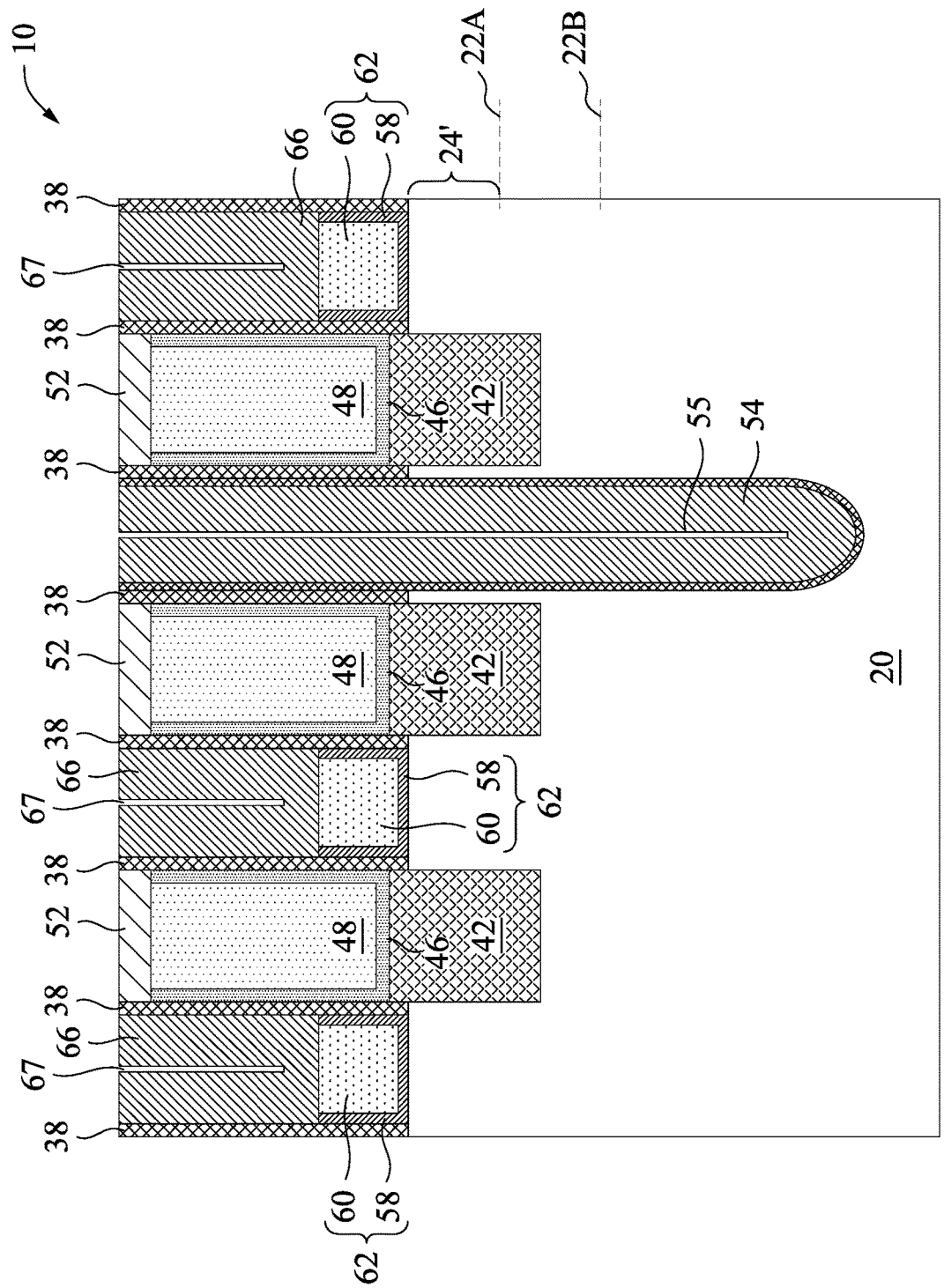

Next, as shown in FIG. 12, dielectric hard masks 66, which are sometimes referred to as Self-Aligned Contact (SAC) fill layers 66, are formed. The respective process is illustrated as process 226 in the process flow 200 as shown in FIG. 17. Dielectric hard masks 66 may be formed of or comprise SiN, $SiO_2$, SiOC, SiOCN, or the like, or combinations thereof. In accordance with some embodiments, the dielectric material comprises SiN, and the deposition is performed through PEALD using process gases including dichlorosilane and ammonia. Hydrogen ($H_2$) may or may not be added. The deposition process may be performed using PEALD at a temperature in a range between about 350° C. and about 550° C. After the deposition process, a planarization process is performed. The remaining portions of the dielectric material are dielectric hard masks 66. Seams 67 may be formed. Seam 67 may have a width in a range between about 0.5 nm and about 2 nm. When viewed in the top view of wafer 10 such as shown in FIG. 8A, dielectric hard masks 66 are at the same positions as the illustrated dummy gate stacks 30, and seams 67 are in the middle between the gate spacers 38 that are on the opposing sides of the dummy gate stacks 30.

The process conditions such as the temperatures, the deposition rates, etc. may be adjusted to differ dielectric hard masks 66, fin isolation regions 54, and gate isolation regions 50 from each other. For example, the density of fin isolation regions 54 may be higher than the density of dielectric hard masks 66, and the density of dielectric hard masks 66 may further be higher than the density of gate isolation regions 50 in accordance with some embodiments.

Figure 13:
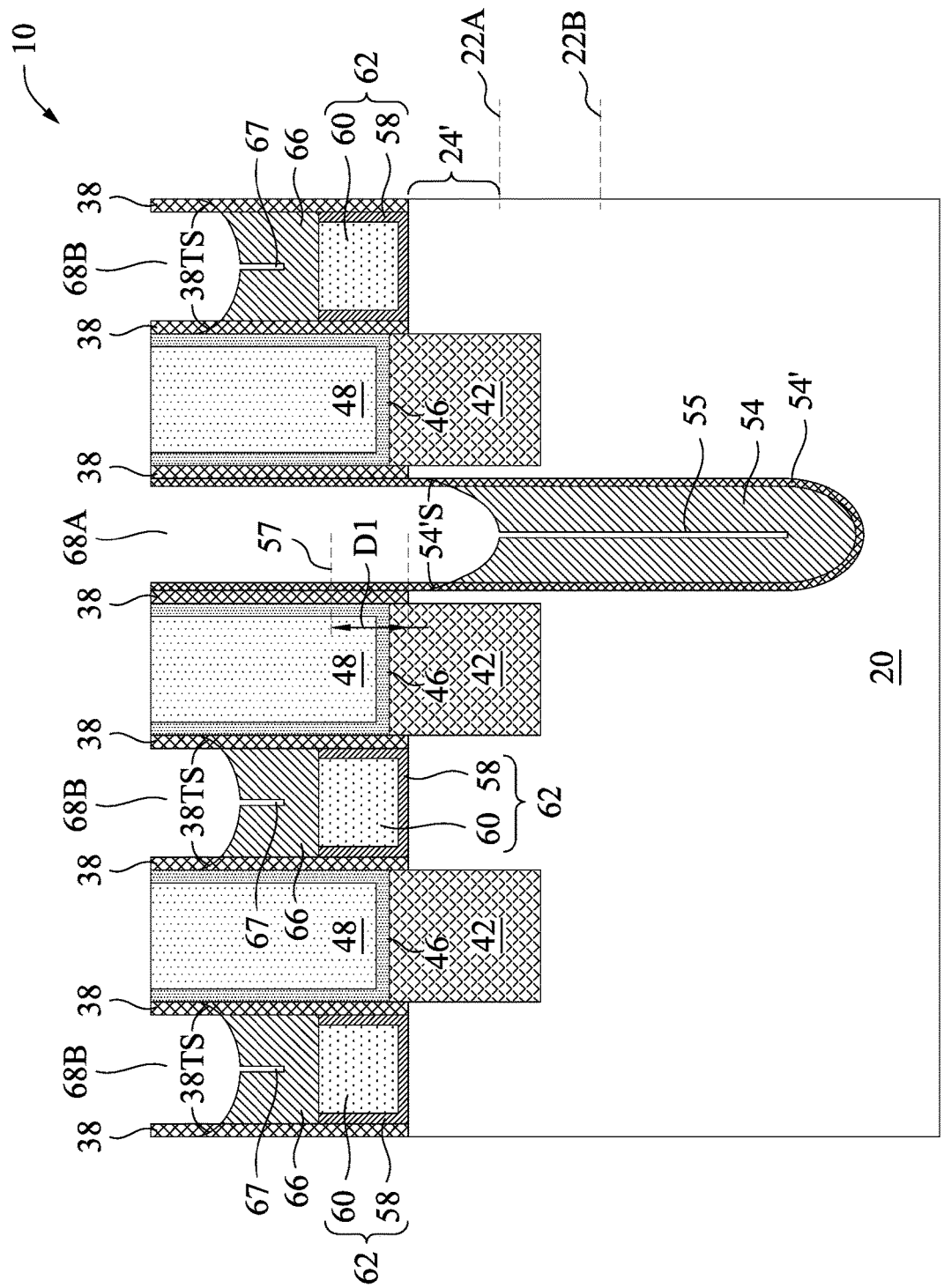

Referring to FIG. 13, dielectric hard masks 66 and fin isolation regions 54 are recessed to form recesses 68A and 68B, respectively, which are referred to collectively as recesses 68. The respective process is illustrated as process 228 in the process flow 200 as shown in FIG. 17. Gate isolation regions 50, which are not in the illustrated plane, may also be recessed. Hard masks 52 may be removed by the recessing process. In accordance with some embodiments, the recessing of dielectric hard masks 66 and fin isolation regions 54 is performed in a common etching process. In accordance with alternative embodiments, the recessing of dielectric hard masks 66 and the recessing of fin isolation regions 54 are performed in separate etching processes. In accordance with some embodiments, liner 54' is not recessed. In accordance with alternative embodiments, liner 54' is recessed, for example, lines 54'S illustrate the possible positions of the top surfaces of liner 54' when it is recessed.

In accordance with some embodiments, the bottoms of fin isolation regions 54 are at a controlled level, for example, at a level lower than dashed line 57, wherein the distance D1 of dashed line 57 from the top surface of protruding fin 24' is selected to be smaller than about 50 nm, or smaller than about 20 nm. The bottom of recess 68A may also be at any level lower than the top surfaces of replacement gate stacks 62, between (or level with) the top surfaces of replacement gate stacks 62 and the top surfaces of protruding fin 24', or lower than the top surfaces of protruding fins 24'. Fin isolation regions 54 may be recessed lower than dielectric hard masks 66. Recesses 68A may also be deeper than recesses 68B. After the recessing, seams 55 and 67 may still exist.

The etching process may include a wet etching process or a dry etching process. For example, when a dry etching process is used, a carbon-and-fluorine containing etching gas ($C_xF_y$-based) such as $CF_4$, $C_2H_6$, etc. may be used. The temperature may be in the range between about 25° C. and about 300° C. The etching duration may be in the range between about 5 seconds and about 300 seconds. When a wet etching process is used, $H_3PO_4$ may be used. In the etching, the temperature may be in the range between about 150° C. and about 200° C. The etching duration may be in the range between about 50 seconds and about 2,000 seconds. The desired depth of recesses 68 may be controlled by controlling the etching time. In accordance with some embodiments, the etching rate of fin isolation regions 54 may be greater than the etching rate of dielectric hard masks 66, which may further be greater than the etching rate of gate isolation regions 50.

During the etching process, ILD 48 and gate spacers 38 are intended not to be etched. For example, the etching selectivity $ER_{50-54-66}/ER_{48}$ and etching selectivity $ER_{50-54-66}/ER_{38}$ may be greater than about 10, wherein $ER_{48}$ is the etching rate of ILD 48, $ER_{38}$ is the etching rate of gate spacers 38, and $ER_{50-54-66}$ are the etching rates of gate isolation regions 50, fin isolation regions 54, and dielectric hard masks 66. Accordingly, ILD 48 and gate spacers 38 are generally not etched. It may also happen that with the recessing of dielectric hard masks 66, gate spacers 38 are etched from their sidewalls, and because gate spacers 38 are thin, gate spacers 38 are also recessed in accordance with some embodiments. In these embodiments, the top surfaces of the recessed gate spacers 38 may be as illustrated as 38TS, which are lower than the top surfaces of ILD 48. The top surfaces 38TS may be slanted. The gate spacers 38 on opposing sides of the replacement gate stacks 62 may be symmetric or may be asymmetric.

Figure 14:
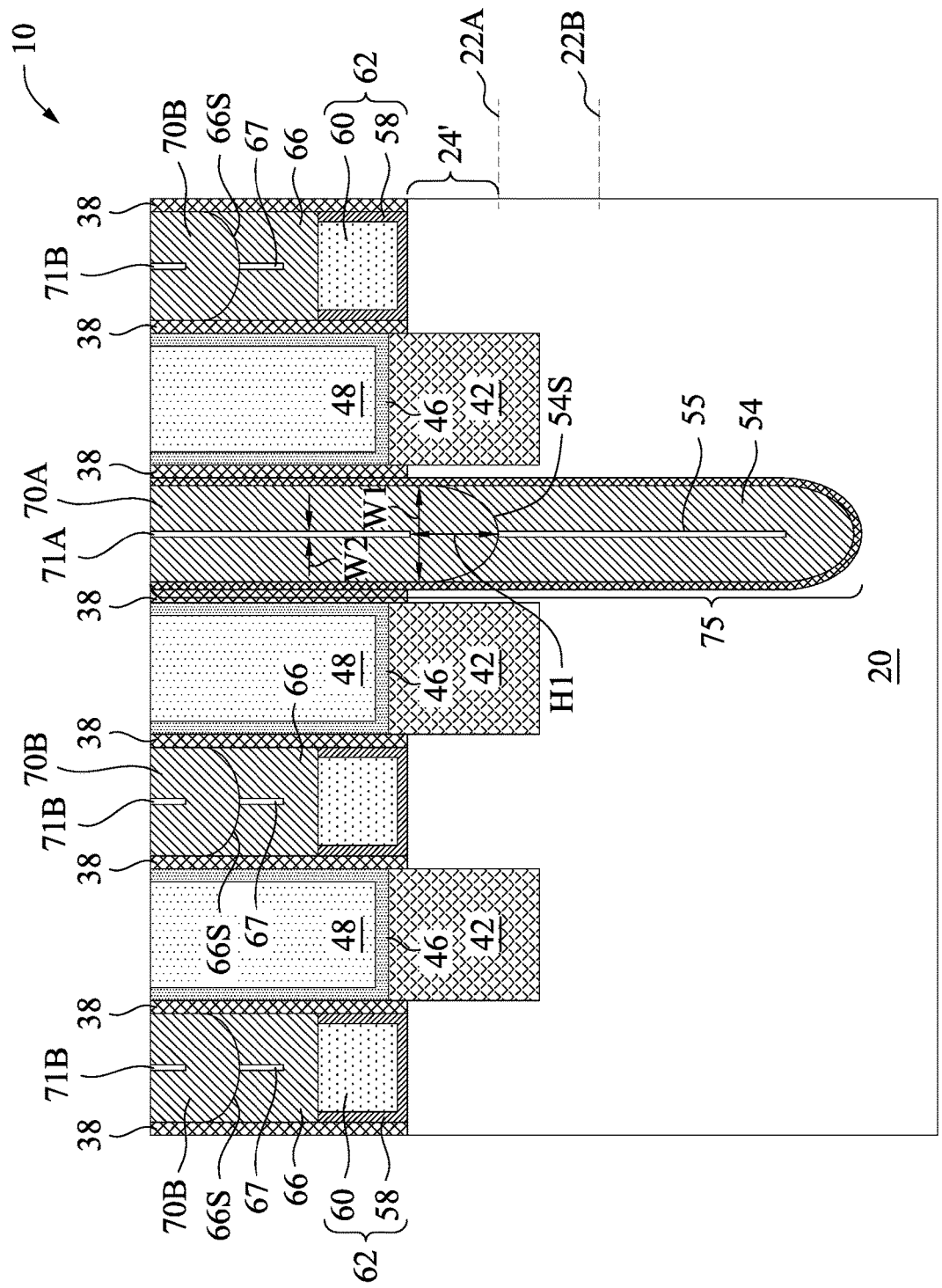

FIG. 14 illustrates the formation of dielectric regions 70A and 70B (collectively referred to as dielectric regions 70). The respective process is illustrated as process 230 in the process flow 200 as shown in FIG. 17. Also, seams 71A and 71B (collectively referred to as seams 71) are formed in dielectric regions 70A and 70B, respectively. In the meantime, dielectric regions (70C, FIGS. 16A and 16B) are formed on the top of the recessed gate isolation regions 50, and dielectric regions 70C and the underlying gate isolation regions 50 may have similar profiles as that of dielectric regions 70B and dielectric hard masks 66. Dielectric regions 70A, 70B, and 70C may be formed in a common deposition process, which may include a conformal deposition process such as ALD or CVD, followed by a common planarization process. Dielectric regions 70A and the underlying remaining fin isolation regions 54 in combination form isolation regions 75.

Seams 71A and 71B may have widths in the range between about 0.5 nm and about 2 nm. In accordance with some embodiments, dielectric regions 70 are formed of or comprise a material selected from SiN, $SiO_2$, SiOC, SiOCN, or the like, or combinations thereof. Also, the material of dielectric regions 70 may be the same as, or different from, the materials of the underlying dielectric hard masks 66, gate isolation regions 50, and/or fin isolation regions 54. The interfaces (such as 54S and 66S as marked) between dielectric regions 70 and the underlying dielectric hard masks 66, gate isolation regions 50, and fin isolation regions 54 may be, or may not be, distinguishable (for example, in a Transmission electron microscopy (TEM image)), regardless of whether they are formed of the same material or different materials. For example, when dielectric hard masks 66, gate isolation regions 50, and fin isolation regions 54 are formed of SiN, the surface layers of dielectric hard masks 66, gate isolation regions 50, and fin isolation regions 54 may be oxidized in natural oxidation to form thin SiON interface layers. FIG. 14 illustrates example interface layers, which are also marked as 66S and 54S. In accordance with some embodiments, interface layers 66S and 54S have U-shapes in the cross-sectional view.

As shown in FIG. 14, the bottom portion of dielectric region 70A separates the overlying seam 71A from the underlying seam 55. The bottom portions of dielectric regions 70B separate the respective overlying seams 71B from the respective underlying seams 67. The bottom portion of dielectric region 70A may have the width W1 in the range between about 12 nm and about 16 nm, which is significantly greater than the width W2, which may be in the range between about 0.5 nm and about 2 nm. The height H1 of the bottom portion of dielectric region 70A may be in the range between about 5 nm and about 20 nm.

Figure 15:
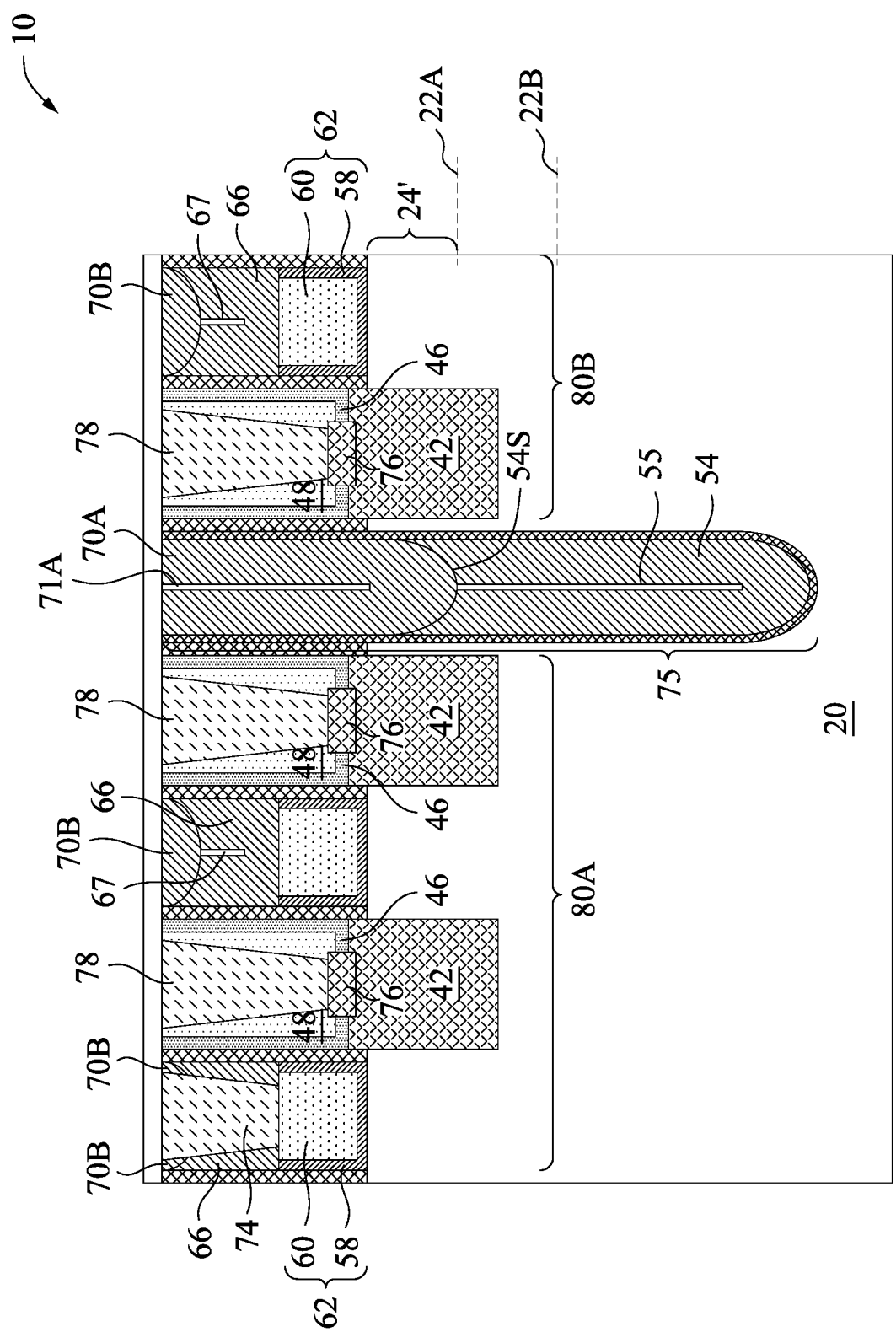

FIG. 15 illustrates the formation of additional features for FinFETs. The respective process is illustrated as process 232 in the process flow 200 as shown in FIG. 17. For example, gate contact plug 74 is formed over and contacting gate electrode 60. Source/drain silicide regions 76 and source/drain contact plugs 78 are also formed to electrically connect to the source/drain regions 42. FinFETs 80A and 80B are thus formed. It is appreciated that the top portions of dielectric regions 70A and 70B may be removed, for example, in the planarization processes and etching processes for forming gate contact plug 74 and source/drain contact plugs 78. Seams 71B may be fully removed along with the corresponding top parts of dielectric regions 70B, and seams 71A may be shortened.

Figure 16A:
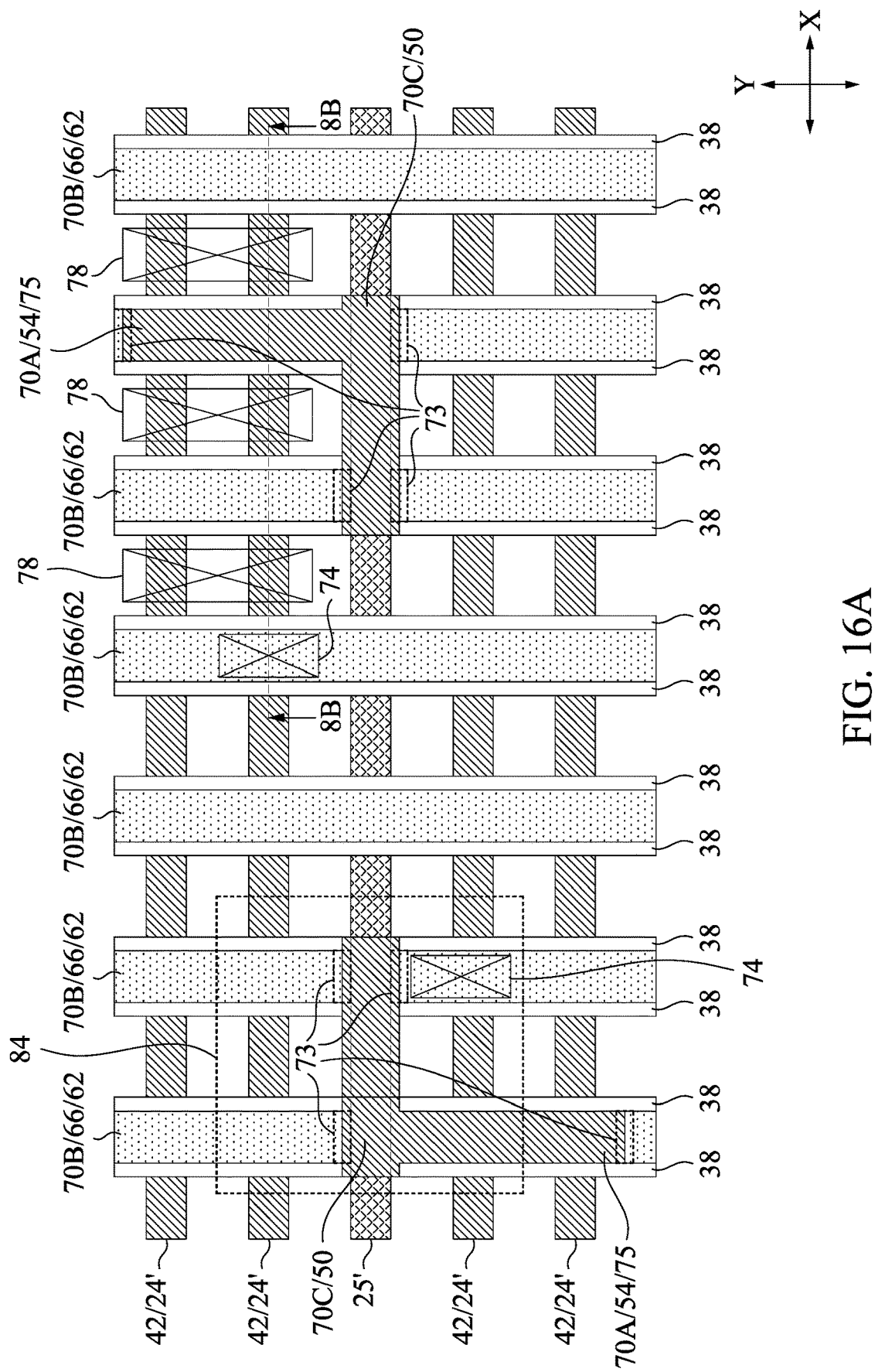
FIG. 16A illustrates a top view of a device region in accordance with some embodiments.

FIG. 16A illustrates a top view of a portion of wafer 10 in accordance with some embodiments. In FIG. 16A, some gate contact plug 74 and source/drain contact plugs 78 are illustrated, while there may be more formed. Dielectric regions 70A and 70B as shown in FIG. 15 are illustrated in FIG. 16A. Furthermore, dielectric regions 70C, which are formed in the same deposition process as dielectric regions 70A and 70B, are also illustrated. It is appreciated that dielectric regions 70A, 70B, and 70C, in the top view, may form a continuous region, with no distinguishable interface therebetween. Alternatively stated, when viewed from top of wafer 10, there are no distinguishable interfaces between dielectric regions 70A, 70B, and 70C, which are formed in same processes. Thus, there are no distinguishable interfaces in regions 73. In accordance with other embodiments, dielectric regions 70C may be fully removed in the processes shown in FIG. 15, and hence in FIGS. 16A and 16B, no dielectric region 70C is left. Instead, gate isolation regions 50 will be visible.

Figure 16B:
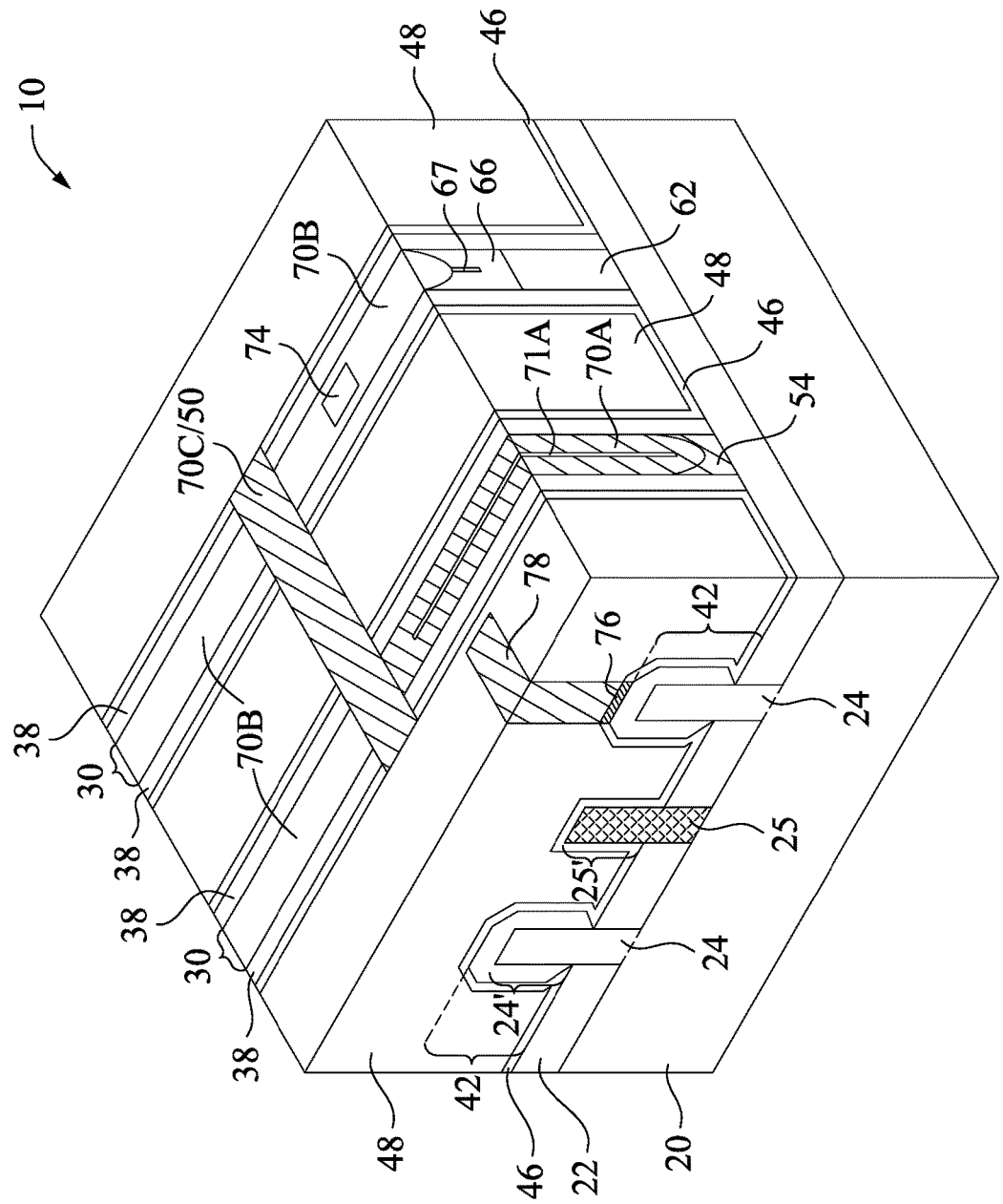
FIG. 16B illustrates a perspective view of a device region in accordance with some embodiments.

FIG. 16B illustrates a perspective view of a region 84 in FIG. 16A. In the illustrated embodiments, the portion of fin isolation region 54 on top of STI region 22 and its overlying dielectric region 70A are illustrated in the perspective view, along with seams 67 and 71A. In other embodiments, fin isolation region 54 is not visible in FIG. 16B because dielectric region 70A extends to the top surface of STI region 22. Dielectric regions 70B and 70C are also shown.

The embodiments of the present disclosure have some advantageous features. By recessing the gate isolation regions, fin isolation regions, and dielectric hard masks, additional dielectric regions may be formed in the resulting recesses. The seams in the gate isolation regions, fin isolation regions, and dielectric hard masks may be sealed. The otherwise tall seams may be separated into shorter upper portions and lower portions. This reduces the problems caused by the seams.

In accordance with some embodiments of the present disclosure, a method comprises forming a semiconductor fin protruding higher than top surfaces of isolation regions, wherein the isolation regions extend into a semiconductor substrate; etching a portion of the semiconductor fin to form a trench, wherein the trench extends lower than bottom surfaces of the isolation regions, and extends into the semiconductor substrate; filling the trench with a first dielectric material to form a first fin isolation region; recessing the first fin isolation region to form a first recess; and filling the first recess with a second dielectric material, wherein the first dielectric material and the second dielectric material in combination form a second fin isolation region. In an embodiment, the first dielectric material comprises a first seam, and the second dielectric material comprises a second seam overlapping the first seam. In an embodiment, the method further comprises removing a top portion of the second dielectric material comprising the second seam, wherein a bottom portion of the second dielectric material free from the second seam remains. In an embodiment, the first dielectric material is same as the second dielectric material. In an embodiment, the method further comprises forming a gate stack on the semiconductor fin; and forming a gate isolation region separating the gate stack into a first portion and a second portion, wherein when the first fin isolation region is recessed, the gate isolation region is also recessed to form a second recess, and the second dielectric material is filled into the second recess. In an embodiment, the method further comprises forming a replacement gate stack on the semiconductor fin; recessing the replacement gate stack; and forming a dielectric hard mask over and contacting the replacement gate stack, wherein when the first fin isolation region is recessed, the dielectric hard mask is also recessed to form an additional recess, and the second dielectric material is filled into the additional recess. In an embodiment, after the recessing the first fin isolation region, a top surface of a remaining portion of the first fin isolation region is lower than an additional top surface of the semiconductor fin.

In accordance with some embodiments of the present disclosure, device comprises a semiconductor substrate; isolation regions extending into the semiconductor substrate; and a dielectric region extending from a first level higher than a top surface of the isolation regions to a second level lower than a bottom surface of the isolation regions, wherein the dielectric region comprises a lower portion having a first seam therein; and an upper portion having a second seam therein, wherein the first seam is spaced apart from the second seam by a bottom part of the upper portion of the dielectric region. In an embodiment, the lower portion and the upper portion have a distinguishable interface therebetween. In an embodiment, the lower portion and the upper portion are formed of a same material, and the distinguishable interface comprises an interface layer, and the interface layer comprises the same material and oxygen. In an embodiment, the second seam overlaps the first seam.

In an embodiment, the method further comprises a first protruding semiconductor fin and a second protruding semiconductor fin having lengthwise directions aligned to a same straight line, wherein the dielectric region separates the first protruding semiconductor fin from the second protruding semiconductor fin. In an embodiment, the device further comprises a first FinFET comprising the first protruding semiconductor fin and a first source/drain region, wherein the first source/drain region is between the first protruding semiconductor fin and the dielectric region; and a second FinFET comprising the second protruding semiconductor fin and a second source/drain region, wherein the second source/drain region is between the second protruding semiconductor fin and the dielectric region. In an embodiment, the device further comprises a gate stack on the first protruding semiconductor fin; and a dielectric hard mask over the gate stack and comprising an additional lower portion with a third seam therein; and an additional upper portion over and contacting the additional lower portion. In an embodiment, the additional upper portion is free from seams.

In accordance with some embodiments of the present disclosure, a device comprises a substrate; isolation regions extending into the substrate; a semiconductor fin extending upwardly from top surfaces of the isolation regions; a first epitaxy semiconductor region and a second epitaxy semiconductor region extending into the semiconductor fin; a first dielectric region laterally between the first epitaxy semiconductor region and the second epitaxy semiconductor region; and a second dielectric region over the first dielectric region, wherein the second dielectric region comprises a U-shaped bottom contacting a top surface of the first dielectric region. In an embodiment, the first dielectric region and the second dielectric region comprise a same dielectric material. In an embodiment, the first dielectric region and the second dielectric region comprise a first seam and a second seam, respectively, and the first seam is separated from the second seam by a portion of the second dielectric region. In an embodiment, the first seam extends to the U-shaped bottom. In an embodiment, a bottom surface of the second dielectric region is lower than an additional top surface of the first epitaxy semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a semiconductor substrate;
isolation regions extending into the semiconductor substrate; and
a dielectric region extending from a first level higher than a top surface of the isolation regions to a second level lower than a bottom surface of the isolation regions, wherein the dielectric region comprises:
a lower portion having a first seam therein; and an upper portion having a second seam therein, wherein the first seam is spaced apart from the second seam by a bottom part of the upper portion of the dielectric region.

2. The device of claim 1, wherein the lower portion and the upper portion have a distinguishable interface therebetween.

3. The device of claim 2, wherein the lower portion and the upper portion are formed of a same material, and the distinguishable interface comprises an interface layer, and the interface layer comprises the same material and oxygen.

4. The device of claim 1, wherein the first seam reaches an additional bottom surface of the lower portion of the dielectric region.

5. The device of claim 1 further comprising a first protruding semiconductor fin and a second protruding semiconductor fin having lengthwise directions aligned to a same straight line, wherein the dielectric region separates the first protruding semiconductor fin from the second protruding semiconductor fin.

6. The device of claim 5 further comprising:
a first Fin Field-Effect Transistor (FinFET) comprising the first protruding semiconductor fin and a first source/drain region, wherein the first source/drain region is between the first protruding semiconductor fin and the dielectric region; and
a second FinFET comprising the second protruding semiconductor fin and a second source/drain region, wherein the second source/drain region is between the second protruding semiconductor fin and the dielectric region.

7. The device of claim 5 further comprising:
a gate stack on the first protruding semiconductor fin; and
a dielectric hard mask over the gate stack and comprising:
an additional lower portion with a third seam therein; and
an additional upper portion over and contacting the additional lower portion.

8. The device of claim 7, wherein the additional upper portion is free from seams.

9. A device comprising:
a substrate;
isolation regions extending into the substrate;
a semiconductor fin extending upwardly from top surfaces of the isolation regions;
a first epitaxy semiconductor region and a second epitaxy semiconductor region extending into the semiconductor fin;
a first dielectric region laterally between the first epitaxy semiconductor region and the second epitaxy semiconductor region; and
a second dielectric region over the first dielectric region, wherein the second dielectric region comprises a U-shaped bottom contacting a top surface of the first dielectric region, and wherein the first dielectric region and the second dielectric region comprise a first seam and a second seam, respectively, and the first seam is separated from the second seam by a portion of the second dielectric region.

10. The device of claim 9, wherein the first dielectric region and the second dielectric region comprise a same dielectric material.

11. The device of claim 9, wherein a topmost point of the second seam is at an additional top surface of the second dielectric region.

12. The device of claim 9, wherein the first seam extends to the U-shaped bottom.

13. The device of claim 9, wherein the second seam is vertically aligned to the first seam.

14. The device of claim 9, wherein the second dielectric region has a first width equal to a second width of the first dielectric region.

15. The device of claim 9 further comprising a dielectric liner, wherein sidewalls of both of the first dielectric region and the second dielectric region physically contact the dielectric liner.

16. The device of claim 15, wherein a semiconductor material of the substrate is between, and physically separates, the dielectric liner and the first epitaxy semiconductor region.

17. A device comprising:
a semiconductor substrate;
a first source/drain region and a second source/drain region extending into the semiconductor substrate;
a first dielectric spacer and a second dielectric spacer over and contacting the semiconductor substrate; and
a dielectric region between, and in contact with, the first dielectric spacer and the second dielectric spacer, wherein the dielectric region is spaced apart from the first source/drain region and the second source/drain region by portions of the semiconductor substrate, and wherein the dielectric region comprises:
a dielectric liner; and
an inner dielectric region comprising an upper portion and a lower portion forming an interface in between, wherein the lower portion comprises a first seam therein, and the upper Portion comprises a second seam therein, with the second seam being vertically aligned to the first seam.

18. The device of claim 17, wherein the interface is curved, with a middle part of the interface being a lowest point of the interface.

19. The device of claim 17, wherein the first seam and the second seam are separated from each other by a portion of the upper portion of the inner dielectric region.

20. The device of claim 18, wherein the first seam joins the lowest point of the interface.

* * * * *